(12) United States Patent
Chang

(10) Patent No.: US 12,300,681 B2
(45) Date of Patent: May 13, 2025

(54) ELECTRONIC PACKAGE AND ELECTRONIC DEVICE

(71) Applicant: Advanced Semiconductor Engineering, Inc., Kaohsiung (TW)

(72) Inventor: Wei-Hao Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 603 days.

(21) Appl. No.: 17/576,822

(22) Filed: Jan. 14, 2022

(65) Prior Publication Data

US 2023/0230966 A1     Jul. 20, 2023

(51) Int. Cl.

| | |
|---|---|
| *H01L 23/34* | (2006.01) |
| *H01L 23/31* | (2006.01) |
| *H01L 25/16* | (2023.01) |
| *H01L 31/0216* | (2014.01) |
| *H01L 31/12* | (2006.01) |
| *H05K 1/02* | (2006.01) |
| *H05K 1/11* | (2006.01) |

(52) U.S. Cl.
CPC ........ *H01L 25/167* (2013.01); *H01L 23/3121* (2013.01); *H01L 31/02164* (2013.01); *H01L 31/12* (2013.01); *H05K 1/028* (2013.01); *H05K 1/115* (2013.01); *H05K 2201/10121* (2013.01)

(58) Field of Classification Search
CPC ... H01L 25/167; H01L 31/0203; H01L 31/12; H05K 1/028; H05K 2201/10121
USPC .................................. 257/98–100, 432–433
See application file for complete search history.

(56) References Cited

U.S. PATENT DOCUMENTS

| | | | | |
|---|---|---|---|---|
| 4,811,081 | A * | 3/1989 | Lyden | ..................... H01L 24/83 257/E21.511 |
| 5,414,299 | A * | 5/1995 | Wang | .................. H01L 23/4985 257/737 |
| 5,477,082 | A * | 12/1995 | Buckley, III | ............ H01L 25/16 257/679 |
| 6,013,948 | A * | 1/2000 | Akram | .............. H01L 23/49883 257/737 |
| 6,054,337 | A * | 4/2000 | Solberg | ................... H01L 25/50 257/E21.705 |
| 8,265,432 | B2 * | 9/2012 | Doany | ................. G02B 6/4206 257/434 |
| 9,557,585 | B1 * | 1/2017 | Yap | ..................... H01L 23/5226 |
| 10,686,096 | B2 | 6/2020 | Ho et al. | |
| 2003/0002770 | A1 * | 1/2003 | Chakravorty | ............ G02B 6/42 385/14 |
| 2012/0001166 | A1 * | 1/2012 | Doany | .................... H01L 27/04 257/E31.127 |

(Continued)

OTHER PUBLICATIONS

U.S. Appl. No. 17/227,152, filed Apr. 9, 2021, Wu et al.

*Primary Examiner* — Nitin Parekh
(74) *Attorney, Agent, or Firm* — FOLEY & LARDNER LLP

(57) ABSTRACT

The present disclosure provides an electronic package. The electronic package includes a substrate, a first component disposed on the substrate and configured to detect an external signal, and an encapsulant disposed on the substrate. The electronic package also includes a protection element disposed on the substrate and physically separating the first device from the encapsulant and exposing the first device. The present disclosure also provides an electronic device.

19 Claims, 44 Drawing Sheets

(56) References Cited

U.S. PATENT DOCUMENTS

2016/0211204 A1* 7/2016 Hu .................... H01L 23/49827
2021/0373132 A1* 12/2021 Etschmaier ....... H01L 31/02325

* cited by examiner

ELECTRONIC PACKAGE AND ELECTRONIC DEVICE

BACKGROUND

1. Technical Field

The present disclosure relates to an electronic package and an electronic device.

2. Description of the Related Art

Numerous methods have been developed to obtain information or signals reflecting physical activity and/or health through non-invasive subject measurements. For example, components or packages (such as system in package (SiP)) may be integrated into wearable devices to achieve the desired sensing ability. Rigid cover or frame may be used to protect the components in the wearable devices. However, the rigid cover tends to be bulky, heavy, and uncomfortable.

SUMMARY

In some embodiments, an electronic package includes a substrate, a first component disposed on the substrate and configured to detect an external signal, and an encapsulant disposed on the substrate. The electronic package also includes a protection element disposed on the substrate and physically separating the first device from the encapsulant and exposing the first device.

In some embodiments, an electronic package includes an adjustable carrier and a sensing device connected to the adjustable carrier and configured to detect an external signal. The sensing device has a sensing region exposed from the adjustable carrier and facing an object when the electronic module is attached to the object.

In some embodiments, an electronic device includes a first substrate, a reflowable conductive material electrically connected to the first substrate, and a first component disposed on the first substrate. The electronic device also includes an element defining a first space accommodating the first component. A thickness of the reflowable conductive material is substantially defined by a height of the element.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
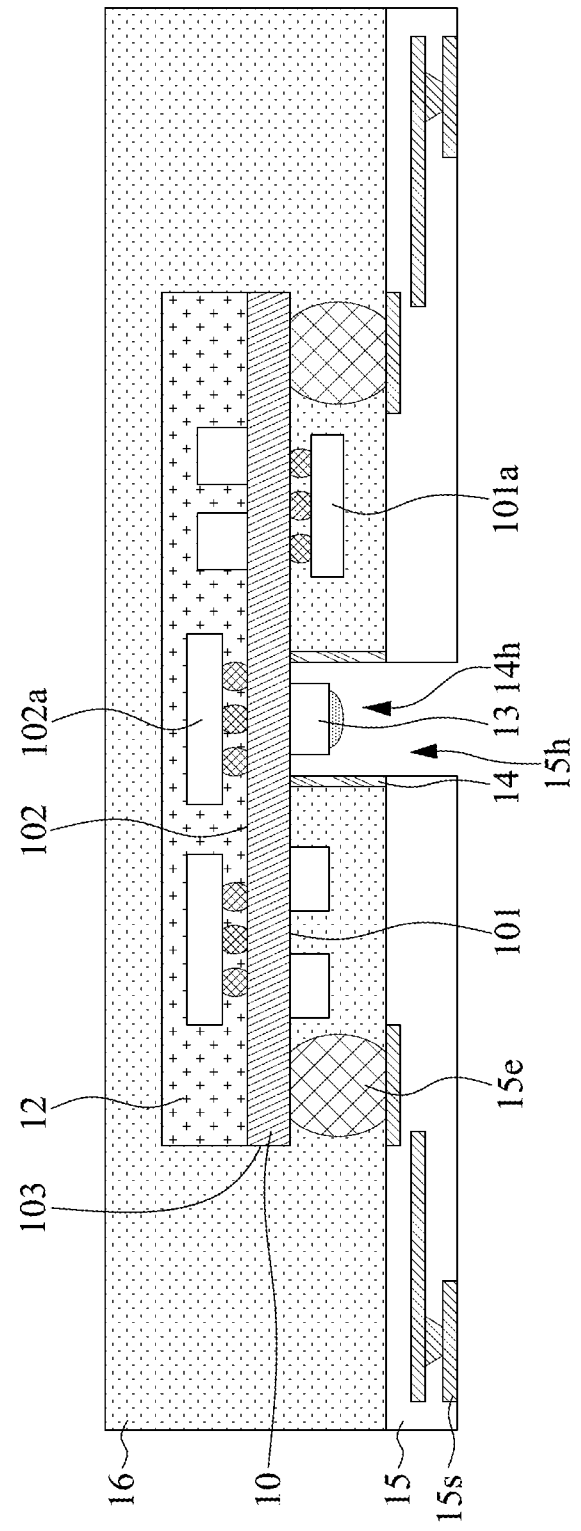
FIG. 1A illustrates a cross-sectional view of an electronic package in accordance with some embodiments of the present disclosure.

The following disclosure provides for many different embodiments, or examples, for implementing different features of the provided subject matter. Specific examples of components and arrangements are described as follows to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A illustrates a cross-sectional view of an electronic package 1a in accordance with some embodiments of the present disclosure.

In some embodiments, the electronic package 1a may include or be a part of an electronic component or an electronic module, such as a system-in-package (SiP) module. In some embodiments, the electronic package 1a may include a wearable device, such as a smartwatch, a smart band, or another smart wearable device.

In some embodiments, the electronic package 1a may be a piece of equipment that detects an external signal by using various detection devices (such as sensors). In some embodiments, the electronic package 1a may perform data communication with a base station or a terminal device (such as a mobile phone) in a wireless communications manner, such as via radio frequency identification technology or short-range wireless communications technology. In some embodiments, the electronic package 1a may be used in combination with a detection device (such as a sensor), an electronic device (such as a signal processing device) and/or other corresponding external devices for further processing acquired signals.

For ease of description, only the smartwatch is used as an example for specific descriptions in specific embodiments of the present invention. Configuration or application of the electronic package 1a in the figures is for illustrative purposes only, and not intended to limit the present disclosure.

Referring to FIG. 1A, the electronic package 1a may include a substrate 10, encapsulants 12, 16, a device 13, a protection layer 14, and an adjustable carrier 15.

In some embodiments, the substrate 10 may include, for example, a printed circuit board, such as a paper-based copper foil laminate, a composite copper foil laminate, or a polymer-impregnated glass-fiber-based copper foil laminate. In some embodiments, the substrate 10 may include an interconnection structure, such as a redistribution layer (RDL) or a grounding element.

In some embodiments, the substrate 10 may include a surface 101, a surface 102 opposite to the surface 101, and a surface (or a lateral surface) 103 extending between the surface 101 and the surface 102. In some embodiments, the surface 101 may be configured to face an object to be detected. For example, when the electronic package 1a is worn by a user, the surface 101 may face the user's skin.

The substrate 10 may include one or more conductive pads (not shown) in proximity to, adjacent to, or embedded in and exposed from the surface 101 and/or 102 of the substrate 10. The substrate 10 may include a solder resist (not shown) on the surface 101 and/or 102 of the substrate 10 to fully expose or to expose at least a portion of the conductive pads for electrical connections.

In some embodiments, one or more devices (or components or electronic components) 101a may be disposed on the surface 101 of the substrate 10. One or more devices (or components or electronic components) 102a may be disposed on the surface 102 of the substrate 10.

In some embodiments, the device 101a and the device 102a may each be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the device 101a and the device 102a may each be a sensor, a processing device, a storage device, or a transmission device. For example, the device 101a and/or the device 102a may be configured to process (e.g., analysis, modify, synthesize, convert to a digital signal, and amplify, etc.), to store, and/or to transmit the detected signal.

In some embodiments, the device 101a and the device 102a may each be electrically connected to one or more other devices (e.g., the device 13) and to the substrate 10 (e.g., to the RDL), and electrical connection may be attained by way of flip-chip or wire-bond techniques.

In some embodiments, the encapsulant 12 may be disposed on the surface 102 of the substrate 10 to cover the device 102a.

In some embodiments, the encapsulant 12 may include an epoxy resin having fillers, a molding compound (e.g., an epoxy molding compound or other molding compound), a polyimide, a phenolic compound or material, a material with a silicone dispersed therein, or a combination thereof. In some embodiments, the encapsulant 12 may include an opaque material. In some embodiments, the opaque material may be an opaque epoxy (e.g., a black epoxy) or other opaque resin or polymer.

In some embodiments, the device (or component or electronic component) 13 may be disposed on the surface 101 of the substrate 10. In some embodiments, the device 13 may be configured to detect or collect one or more signals or pieces of information external to the electronic package 1a. For example, the device 13 may be configured to detect light, sound, temperature, air pressure, smell, particle, humidity, or other environmental variables. For example, the device 13 may include an optical sensor, a microphone, a temperature sensor, a pressure sensor, a particle sensor, or other sensing devices configured to detect an external signal. For example, when the electronic package 1a is worn by a user, the device 13 may be configured to detect or collect one or more signals (e.g., biosignals) or pieces of information associated with the user.

In some embodiments, the device 13 may include one or more transmitters (such as an optical transmitter, or a light-emitting diode (LED)), one or more receivers (such as an optical receiver or a photodiode (PD)), or a combination thereof. In some embodiments, the optical transmitter may be configured to emit or radiate a light to an object (such as the user's skin) and the optical receiver is configured to receive a light reflected from the object as an external signal.

In some embodiments, the optical transmitter and the optical receiver may be configured to operate with lights having different bandwidths. In some embodiments, the optical transmitter may be configured to radiate a single-band light and the optical receiver is configured to receive a multi-band light (such as in the spectrum of about 900 nanometers (nm) to about 1300 nm)).

For example, when the electronic package 1a is worn by a user, the light radiated by the device 13 (e.g., the optical transmitter) may reach the user's skin and may be reflected by hemoglobin in a blood vessel. The device 13 (e.g., the optical receiver) may receive the reflected light as an external signal. The device 101a and/or the device 102a may further process the external signal, so as to obtain the detection result, such as oxygen saturation (SpO2), heart rate (HR), heart rate variability (HRV), respiratory rate (breaths per minute, brpm), pulse travel time (PTT), electroencephalogram (EEG), electrocardiogram (ECG), electromyogram (EMG), electrooculogram (EOG), galvanic skin response (GSR), sweat composition, or other biologically-relevant information.

The positions, functions, and number of devices in the electronic package 1a are not intended to limit the present disclosure. For example, there may be any number of devices in the electronic package 1a due to design requirements.

In some embodiments, the protection layer (or protection element) 14 may be disposed on the surface 101 of the substrate 10. In some embodiments, the protection layer 14 may be configured to define a space (or a location) 14h to accommodate or dispose the device 13. For example, the device 13 may be disposed, received, or accommodated in the space 14h defined by the protection layer 14. In some embodiments, the protection layer 14 may be configured to physically separate the device 13 from an encapsulant (such as the encapsulant 16 in FIGS. 1A, 1B, 1C, 1D, another encapsulant 11 shown in FIGS. 1E and 1F, or another encapsulant 19 shown in FIG. 1G) and to expose an active area (e.g., an emitting region and/or a sensing region) of the device 13. For example, an active area of the device 13 may be exposed from the protection layer 14. For example, an active area of the device 13 may not be covered by the protection layer 14.

In some embodiments, the protection layer 14 may be physically separated from the device 13. For example, the protection layer 14 may not be in contact with the device 13. In some embodiments, the protection layer 14 may surround one or more lateral surfaces of the device 13. For example, the protection layer 14 may fully surround the lateral surfaces of the device 13.

In some embodiments, the protection layer 14 may include a lid, a frame, a plate, a peripheral wall, or other structures. In some embodiments, the protection layer 14 may include a metal, a plastic, a ceramic, or other feasible materials. In some embodiments, the protection layer 14 may include an opaque material. In some embodiments, the opaque material may be an opaque epoxy (e.g., a black epoxy) or other opaque resin or polymer that does not allow the wavelength(s) of light radiated by the device 13 to pass through. In some embodiments, the protection layer 14 may not allow external light to pass through and to be detected by the device 13.

In some embodiments, the substrate 10 may be disposed on the adjustable carrier 15. In some embodiments, the adjustable carrier 15 may be configured to connect or attach the electronic package 1a to an object (e.g., the user's skin). In some embodiments, the adjustable carrier 15 may be adhesive to the object. In some embodiments, the adjustable carrier 15 may be configured to adjust the distance between the object and the active area (e.g., an emitting region and/or a sensing region) of the device 13.

In some embodiments, the adjustable carrier 15 may include a flexible connection element, such as a flexible printed circuit (FPC).

In some embodiments, the adjustable carrier 15 may have a through hole 15h penetrating the adjustable carrier 15. In some embodiments, the device 13 may be disposed adjacent to the through hole 15h of the adjustable carrier 15. In some embodiments, the device 13 may be exposed from the through hole 15h of the adjustable carrier 15. For example, the device 13 may be exposed to air through the through hole 15h of the adjustable carrier 15. In some embodiments, the device 13 may face the object through the through hole 15h of the adjustable carrier 15 when the electronic package 1a is attached or connected to the object.

For example, when the electronic package 1a is worn by a user, the device 13 may be exposed to (or face) the user's skin through the through hole 15h of the adjustable carrier 15. External signals (e.g., the reflected light) may pass or be transmitted through the through hole 15h of the adjustable carrier 15 and reach the device 13.

In some embodiments, the protection layer 14 may contact the adjustable carrier 15. For example, the protection layer 14 may extend between the substrate 10 and the adjustable carrier 15. In some embodiments, the space 14h of the protection layer 14 may be adjacent to the through hole 15h of the adjustable carrier 15. In some embodiments, the space 14h of the protection layer 14 may be aligned with the through hole 15h of the adjustable carrier 15. In some embodiments, the protection layer 14 may have a surface substantially coplanar with a sidewall of the through hole 15h. In some embodiments, the space 14h of the protection layer 14 and the through hole 15h may together define a space or a location to accommodate or dispose the device 13.

In some embodiments, the through hole 15h of the adjustable carrier 15 and the device 13 may be overlapping in a direction substantially perpendicular to the surface 101 of the substrate 10. In some embodiments, the through hole 15h of the adjustable carrier 15 and the device 13 may be non-overlapping in a direction substantially parallel to the surface 101 of the substrate 10. In some embodiments, the device 13 may not extend within the through hole 15h of the adjustable carrier 15. In some embodiments, the device 13 may not penetrate the adjustable carrier 15. For example, the topmost surface of the device 13 may not extend over the adjustable carrier 15. For example, the topmost surface of the device 13 may not exceed the protection layer 14.

In some embodiments, the substrate 10 may be electrically connected with the adjustable carrier 15 through a connector 15e. In comparison with the protection layer 14, the shape, the thickness, or the height of the connector 15e is more unstable and difficult to control. The protection layer 14 can help define the shape, the thickness, or the height of the connector 15e.

In some embodiments, the connector 15e may be shaped or deformed when the temperature and/or the pressure in the manufacturing process are changed. In some embodiments, the connector 15e may include a temperature-dependent shape changing material or a heat-sensitive shape changing material. For example, the shape, the thickness, or the height of the connector 15e may be changed according to the temperature. In some embodiments, the connector 15e may include a reflowable conductive material, such as a soldering material. In some embodiments, the connector 15e may include one or more solder balls or solder bumps, such as a controlled collapse chip connection (C4) bump, a ball grid array (BGA) or a land grid array (LGA). In some embodiments, the connector 15e may include a thermoplastic material or a material that may become a soft material when it is heated and become hard when it is cooled. In some embodiments, the connector 15e may include a thermosetting material or a material that may be hardened after an application of heat and/or pressure, such as an anisotropic conductive film. In some embodiments, the connector 15e may include a copper (Cu) pillar, a conductive via, a conductive wire, or other feasible connectors.

In some embodiments, the adjustable carrier 15 may include one or more sensing elements 15s. When the electronic package 1a is worn by a user, the sensing element 15s may contact the user's skin.

In some embodiments, the sensing element 15s may be configured to detect or collect one or more signals or pieces of information external to the electronic package 1a. For example, when the electronic package 1a is worn by a user, the sensing element 15s may be configured to detect or collect one or more signals (e.g., biosignals) or pieces of information associated with the user. The signals detected by the sensing element 15s may be transmitted (by the adjustable carrier 15) to the substrate 10 and be further processed (by, for example, the device 101a and/or the device 102a) to determine a biological parameter of the user, such as ECG or other biologically-relevant information described.

In some embodiments, the encapsulant 16 may be disposed on the adjustable carrier 15 to cover the encapsulant 12, the substrate 10, and the connector 15e. In some embodiments, the encapsulant 16 may be disposed on the surface 101 of the substrate 10 to cover or contact the device 101a on the surface 101. In some embodiments, the encapsulant 16 may cover or contact the surface 103 of the substrate 10. In some embodiments, the encapsulant 16 may cover or contact the protection layer 14.

In some embodiments, the encapsulant 16 may be physically separated from the device 13 by the protection layer 14. For example, the encapsulant 16 may be spaced apart from the device 13 by the protection layer 14. For example, the encapsulant 16 may not contact the device 13. For example, the encapsulant 16 may not be present in the space 14s defined by the protection layer 14. For example, the encapsulant 16 may not be present in the through hole 15h of the adjustable carrier 15. However, in some other embodiments, the encapsulant 16 may be present in the space 14s defined by the protection layer 14 and/or the through hole 15h of the adjustable carrier 15, as shown in FIG. 1E.

In some embodiments, the encapsulant 16 may include an epoxy resin having fillers, a molding compound (e.g., an epoxy molding compound or other molding compound), a polyimide, a phenolic compound or material, a material with a silicone dispersed therein, or a combination thereof. In some embodiments, the encapsulant 16 may include a light transmissive material. In some embodiments, the light transmissive material may be a clear epoxy or other light transmissive epoxy or other resin or polymer.

In some embodiments, the adjustable carrier 15 and the encapsulant 16 may each be soft and flexible enough for a user of the electronic package 1a to wear comfortably for an extended time period. In some embodiments, the adjustable carrier 15 and the encapsulant 16 may each be relatively more resistant to stress, impact, twisting or other physical or structural changes.

In some embodiments, the adjustable carrier 15 may be omitted. For example, the encapsulant 16 may be directly attached or connected with the object. In the embodiments where the adjustable carrier 15 is omitted, the sensing element 15s may be integrated into the encapsulant 16.

In a comparative embodiment, a rigid cover or frame may be used to protect devices in a wearable device. However, the rigid cover tends to be bulky, heavy, and uncomfortable.

According to some embodiments of the present disclosure, by miniaturizing the rigid structure (e.g., the protection layer 14) and using a relative soft material (e.g., the adjustable carrier 15 and/or the encapsulant 16) to protect or surround the devices (such as the devices 101a, 102a, and 13) in the electronic package 1a, the flexibility of the electronic package 1a can be increased and the user's experience can be enhanced.

Figure 1E:
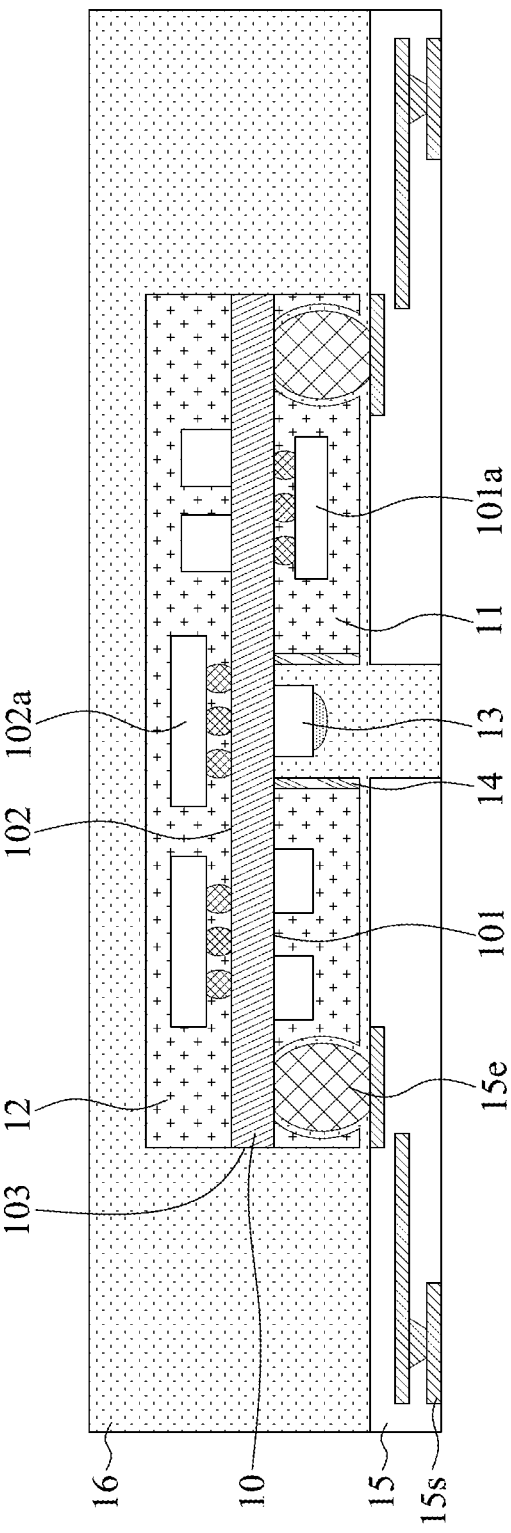
FIG. 1E illustrates a cross-sectional view of an electronic package in accordance with some embodiments of the present disclosure.
Figure 2C:
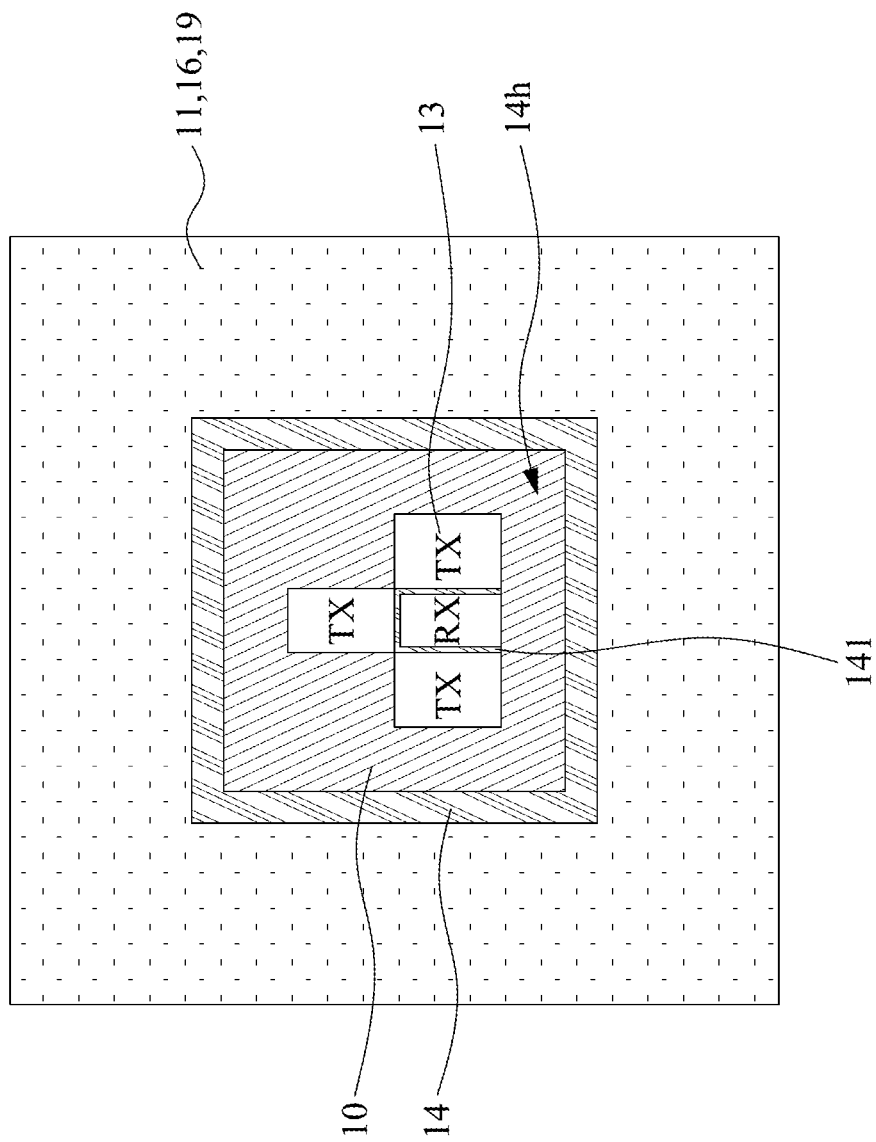
FIG. 2C illustrates a top view of an electronic package in accordance with some embodiments of the present disclosure.

In some embodiments, the protection layer 14 can prevent the device 13 from being covered by an opaque material (such as the encapsulant 11 in FIG. 1E) and increase the luminosity of the device 13. In some embodiments, the protection layer 14 can prevent crosstalk between the one or more transmitters and the one or more receivers of the device 13 (as shown in FIG. 2C). In some embodiments, the protection layer 14 can define the distance between the substrate 10 and the adjustable carrier 15 and enhance the process capability (as shown in FIG. 3E, 4B, and 5E). For example, a thickness of the connector 15e may be substantially defined by a height of the protection layer 14. For example, a thickness of the opaque material or encapsulant may be substantially defined by a height of the protection layer 14. For example, the protection layer 14 and the adjustable carrier 15 may collectively define a space for accommodating the device 101a. The distance between the substrate 10 and the adjustable carrier 15 may be thicker than the thickness of the device 101a.

In addition, since the sensing device (e.g., the device 13 and/or the sensing element 15s) can be disposed firmly and closer to the object (e.g., the user's skin), the signal noise can be reduced and the detection result can be more accurate.

Figure 1B:
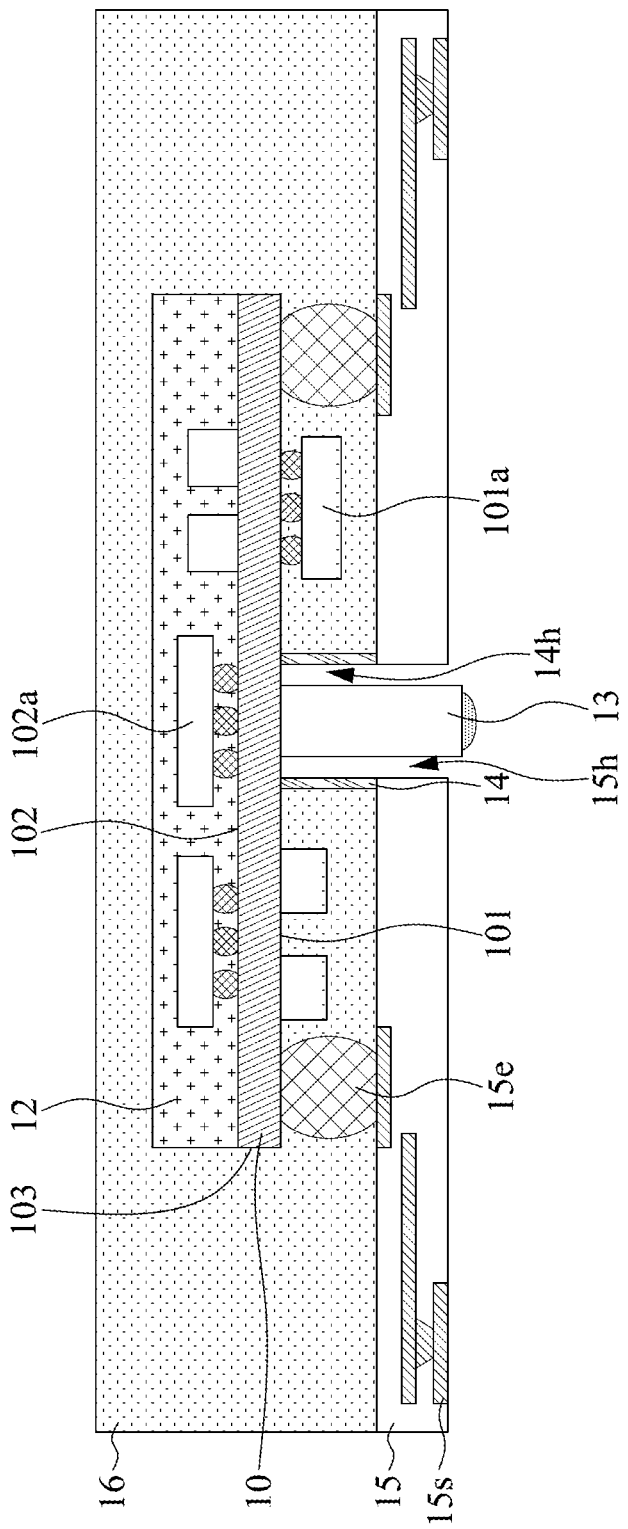
FIG. 1B illustrates a cross-sectional view of an electronic package in accordance with some embodiments of the present disclosure.

FIG. 1B illustrates a cross-sectional view of an electronic package 1b in accordance with some embodiments of the present disclosure. The electronic package 1b is similar to the electronic package 1a in FIG. 1A except for the differences described as follows.

In some embodiments, the device 13 may be outside the through hole 15h of the adjustable carrier 15 as shown in FIG. 1A. In some embodiments, the device 13 may at least partially extend within the through hole 15h of the adjustable carrier 15. In some embodiments, the device 13 may at least partially penetrate the adjustable carrier 15. In some embodiments, the device 13 may exceed the protection layer 14. In some embodiments, the device 13 may extend over the adjustable carrier 15. In some embodiments, the device 13 may protrude from the adjustable carrier 15. In some other embodiments, the topmost surface of the device 13 may be flush with a surface of the adjustable carrier 15. The height of the device 13 may be adjusted according to design requirements and is not intended to limit the present disclosure.

Figure 1C:
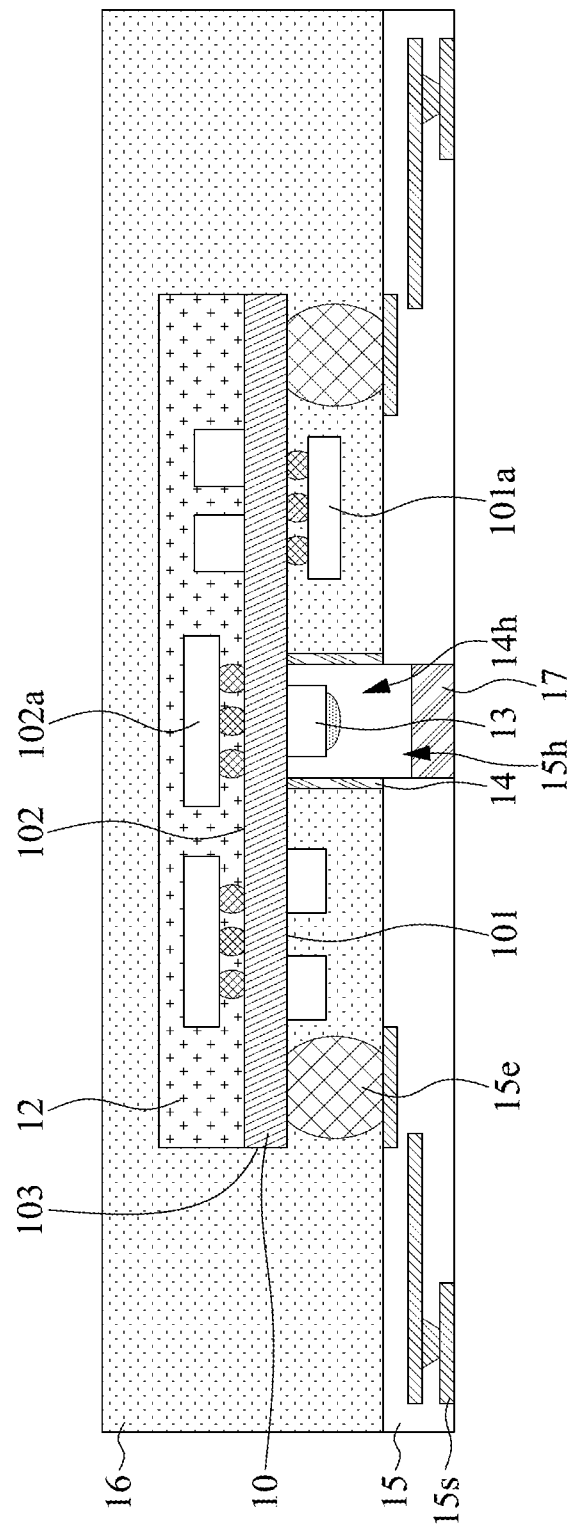
FIG. 1C illustrates a cross-sectional view of an electronic package in accordance with some embodiments of the present disclosure.

FIG. 1C illustrates a cross-sectional view of an electronic package 1c in accordance with some embodiments of the present disclosure. The electronic package 1c is similar to the electronic package 1a in FIG. 1A except for the differences described as follows.

The electronic package 1c may include a light transmissive material 17 disposed in the through hole 15h of the adjustable carrier 15. In some embodiments, the light transmissive material 17 may include an optical structure. The optical structure may include, for example, a prism, a lens, a flat surface, a diffuser, a shutter, a filter, a holographic element, etc.

In some embodiments, the light transmissive material 17 may be spaced apart from the device 13. In some embodiments, the space between the light transmissive material 17 and the device 13 may be filled with air or may be vacuumed. In some embodiments, the light transmissive material 17 may be configured to direct the light radiated from the device 13. For example, the light transmissive material 17 may be configured to focus the light radiated from the device 13 and to increase the intensity thereof. In some embodiments, the light transmissive material 17 may be configured to direct and/or restrict the acceptance angle of the detected light, so as to increase the sensitivity of the device 13.

Figure 1D:
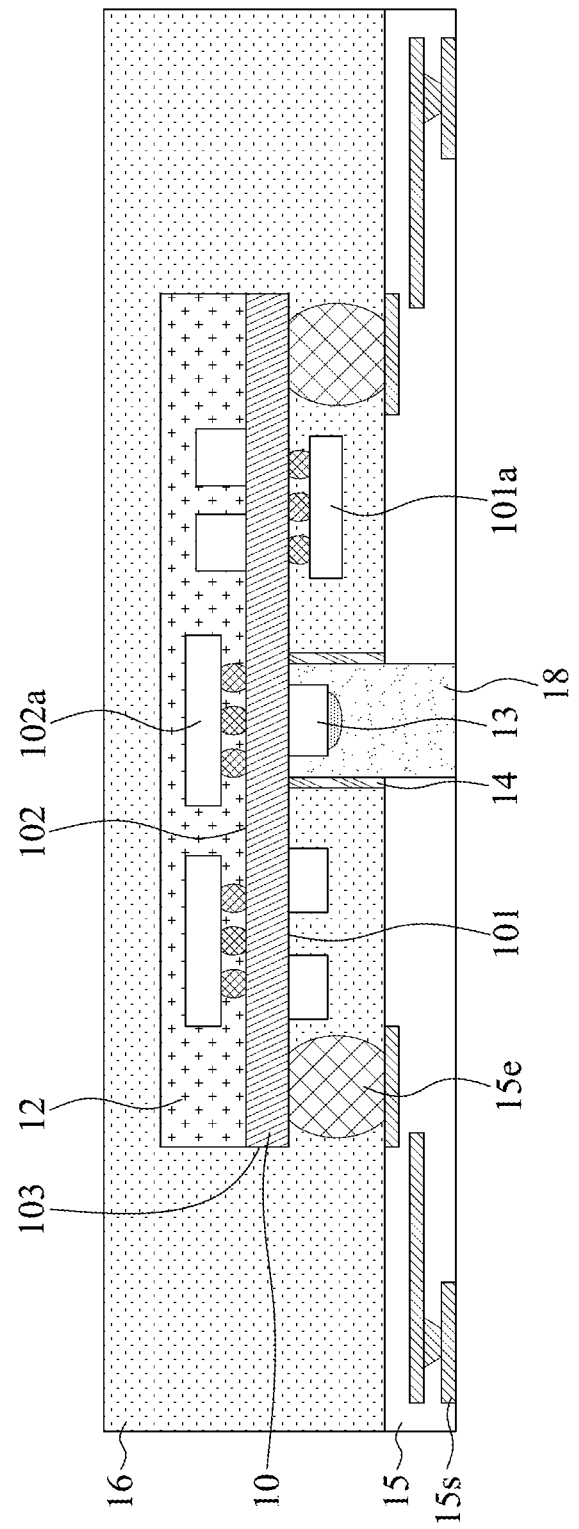
FIG. 1D illustrates a cross-sectional view of an electronic package in accordance with some embodiments of the present disclosure.

FIG. 1D illustrates a cross-sectional view of an electronic package 1d in accordance with some embodiments of the present disclosure. The electronic package 1d is similar to the electronic package 1a in FIG. 1A except for the differences described as follows.

The electronic package 1c may include a light transmissive material 18 disposed on the surface 101 of the substrate 10 to cover the device 13. In some embodiments, the light transmissive material may include a gel. In some embodiments, the light transmissive material may be a clear epoxy or other light transmissive epoxy or other resin or polymer. For example, the light transmissive material 18 may be disposed on the device 13 (which is exposed from the protection layer 14). For example, the light transmissive material 18 may cover the active area (e.g., an emitting region and/or a sensing region) of the device 13.

For example, the light transmissive material 18 may be disposed within the space 14h defined by the protection layer 14. For example, the light transmissive material 18 may fill up the space 14h defined by the protection layer 14. For example, the light transmissive material 18 may be disposed within the through hole 15h of the adjustable carrier 15. For example, the light transmissive material 18 may fill up the through hole 15h of the adjustable carrier 15.

FIG. 1E illustrates a cross-sectional view of an electronic package 1e in accordance with some embodiments of the present disclosure. The electronic package 1e is similar to the electronic package 1a in FIG. 1A except for the differences described as follows.

The electronic package 1e may include an encapsulant 11 disposed on the surface 101 of the substrate 10 to cover the device 101a.

In some embodiments, the encapsulant 11 may include an epoxy resin having fillers, a molding compound (e.g., an epoxy molding compound or other molding compound), a polyimide, a phenolic compound or material, a material with a silicone dispersed therein, or a combination thereof. In some embodiments, the encapsulant 11 may include an opaque material. In some embodiments, the opaque material may be an opaque epoxy (e.g., a black epoxy) or other opaque resin or polymer.

In some embodiments, the encapsulant 11 and the encapsulant 12 may have the same material. In some embodiments, the encapsulant 11 and the encapsulant 12 may be formed by a one-time molding operation. For example, the encapsulant 11 and the encapsulant 12 may be connected. For example, the encapsulant 11 and/or the encapsulant 12 may cover the surface 103 of the substrate 10.

In some embodiments, the encapsulant 11 may contact the protection layer 14. In some embodiments, as mentioned, the protection layer 14 may be configured to physically separate the device 13 from the encapsulant 11, to expose an active area (e.g., an emitting region and/or a sensing region) of the device 13, and thus increase the luminosity of the device 13.

Figure 6A:
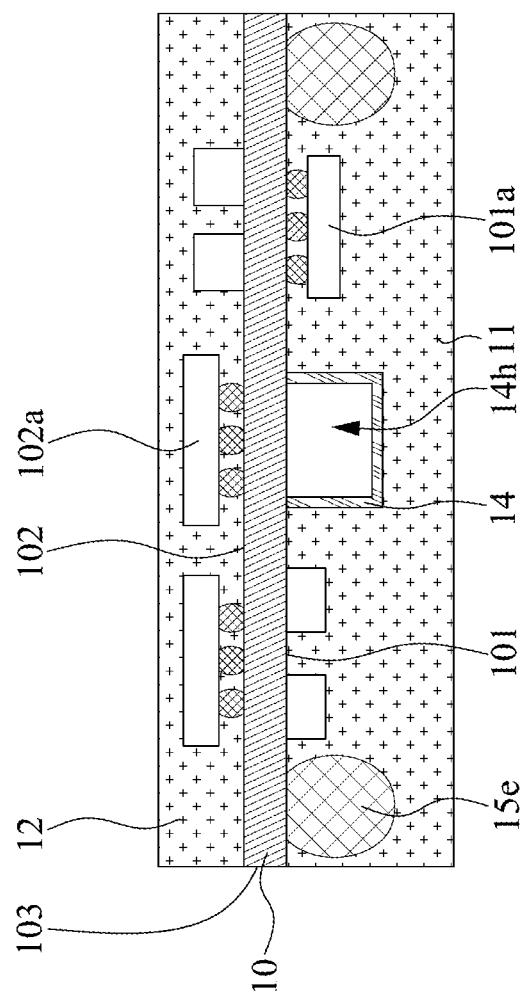
FIG. 6A, FIG. 6B, FIG. 6C, FIG. 6D, FIG. 6E, and FIG. 6F illustrate cross-sectional views in one or more stages of a method of manufacturing an electronic package in accordance with an embodiment of the present disclosure.
Figure 6B:
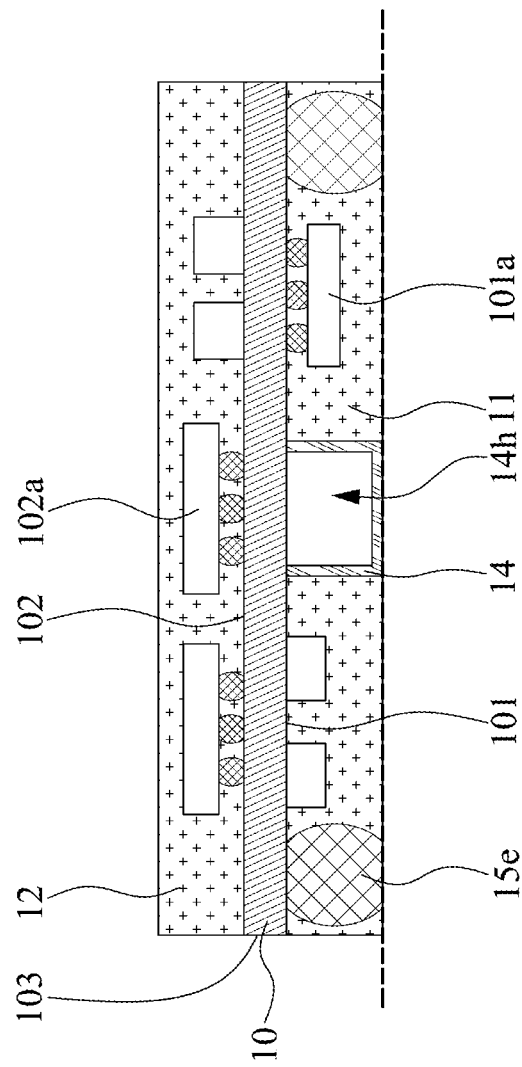
Figure 6C:
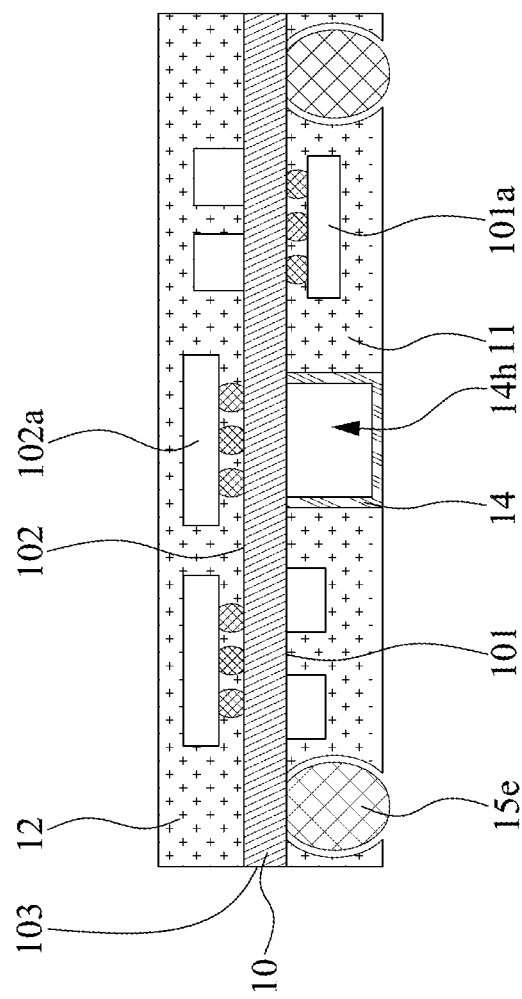

In some embodiments, the encapsulant 11 may be spaced apart from the connector 15e due to a reflow operation or a reballing operation (such as the operation shown in FIG. 6C). In some embodiments, the gap may be filled with the encapsulant 16.

In some embodiments, the encapsulant 11 may define the distance between the substrate 10 and the adjustable carrier 15 and enhance the process capability. Therefore, it may not be necessary for the protection layer 14 to contact the adjustable carrier 15. For example, the protection layer 14 may be spaced apart from the adjustable carrier 15. In some embodiments, a surface of the encapsulant 11 may be substantially coplanar with a surface of the protection layer 14. In some embodiments, a thickness of the encapsulant 11 may be substantially defined by a height of the protection layer 14.

In some embodiments, the encapsulant 16 may cover or surround the encapsulant 11. In some embodiments, the encapsulant 16 may be disposed within the space 14h defined by the protection layer 14. For example, the encapsulant 16 may fill up the space 14h defined by the protection layer 14. For example, the encapsulant 16 may be disposed within the through hole 15h of the adjustable carrier 15. For example, the encapsulant 16 may fill up the through hole 15h of the adjustable carrier 15. However, in some other embodiments, the encapsulant 16 may not present in the space 14s defined by the protection layer 14 and/or the through hole 15h of the adjustable carrier 15, as shown in FIG. 1A.

Figure 1F:
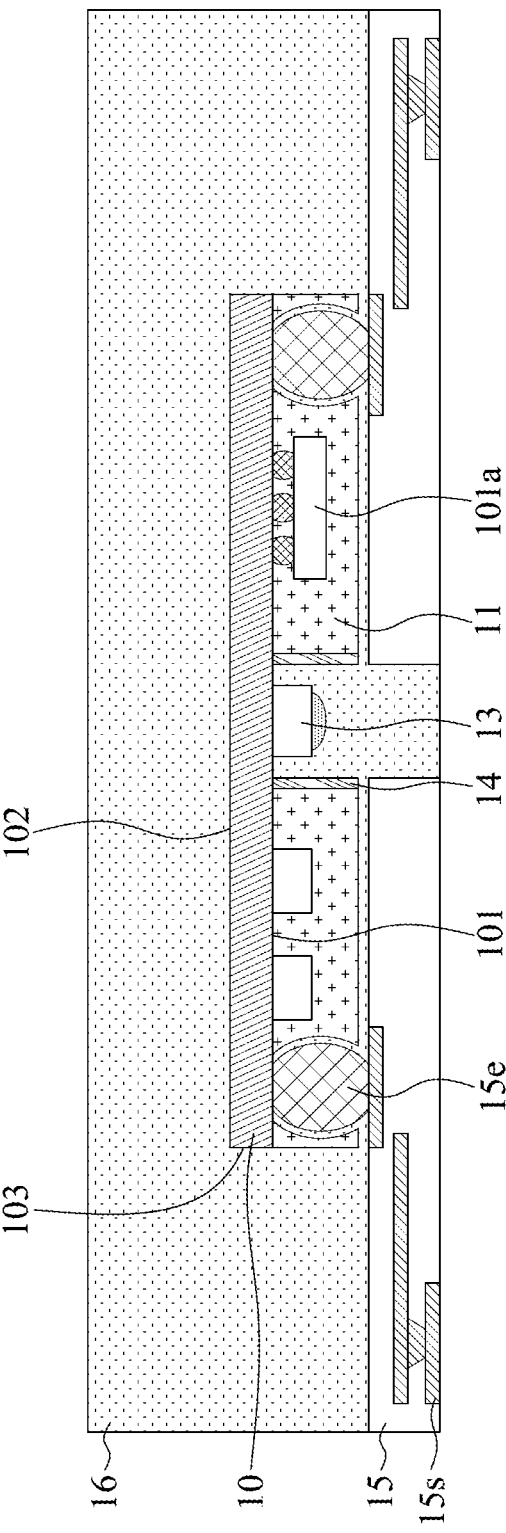
FIG. 1F illustrates a cross-sectional view of an electronic package in accordance with some embodiments of the present disclosure.

FIG. 1F illustrates a cross-sectional view of an electronic package 1f in accordance with some embodiments of the present disclosure. The electronic package 1f is similar to the electronic package 1e in FIG. 1E except for the differences described as follows.

The encapsulant 12 and the device 102a on the surface 102 of the substrate 10 may be omitted in FIG. 1F. In some embodiments, the encapsulant 16 may be disposed on the surface 102 of the substrate 10.

Figure 1G:
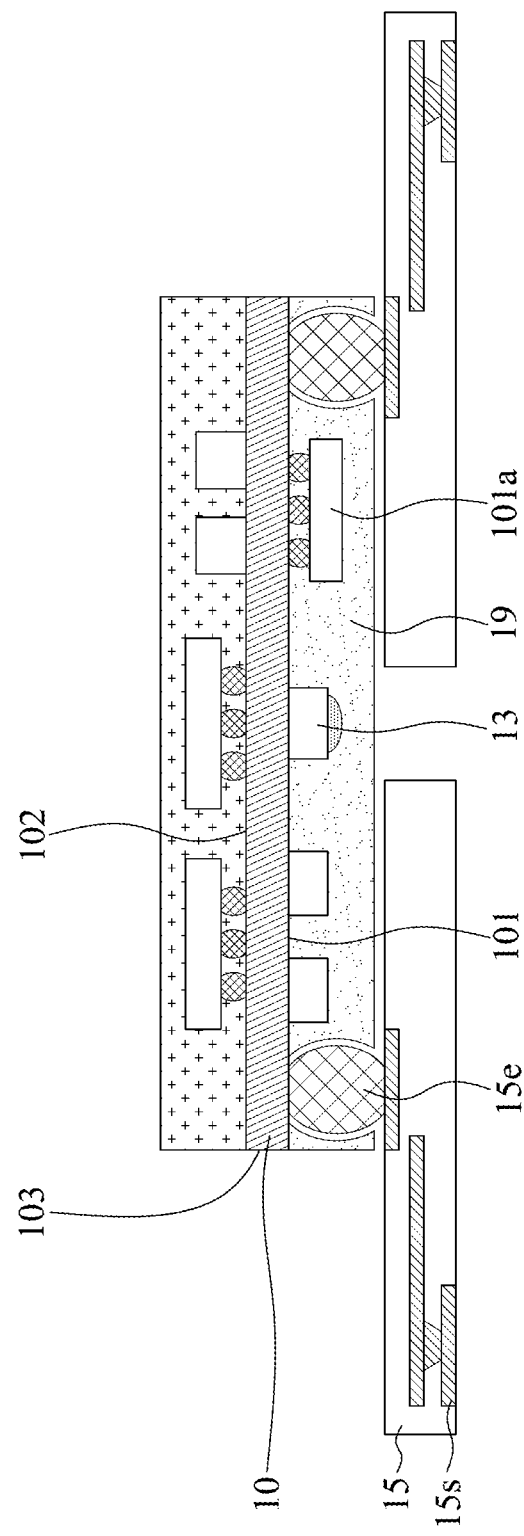
FIG. 1G illustrates a cross-sectional view of an electronic package in accordance with some embodiments of the present disclosure.

FIG. 1G illustrates a cross-sectional view of an electronic package 1g in accordance with some embodiments of the present disclosure. The electronic package 1g is similar to the electronic package 1a in FIG. 1A except for the differences described as follows.

The protection layer 14 and the encapsulant 16 may be omitted in FIG. 1G. The device 13 may be covered by an encapsulant 19. In some embodiments, the encapsulant 19 may include a light transmissive material. In some embodiments, the light transmissive material may be a clear epoxy or other light transmissive epoxy or other resin or polymer.

Figure 7A:
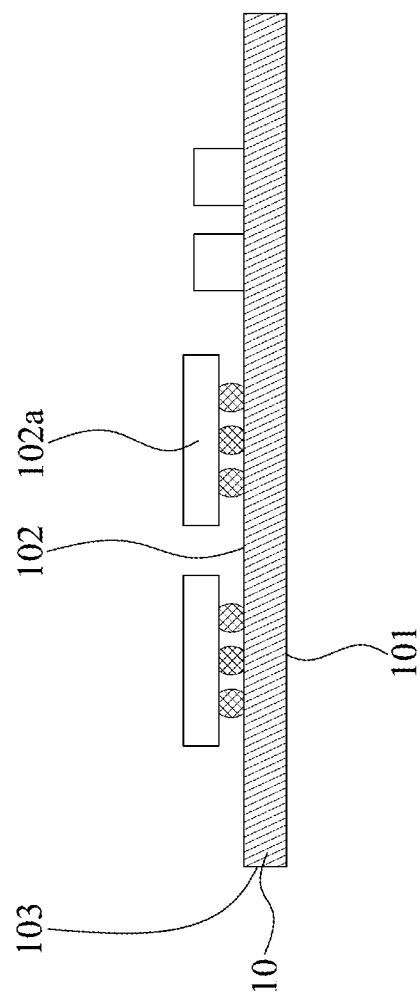
FIG. 7A, FIG. 7B, FIG. 7C, FIG. 7D, FIG. 7E, FIG. 7F, FIG. 7G, and 7H illustrate cross-sectional views in one or more stages of a method of manufacturing an electronic package in accordance with an embodiment of the present disclosure.
Figure 7B:
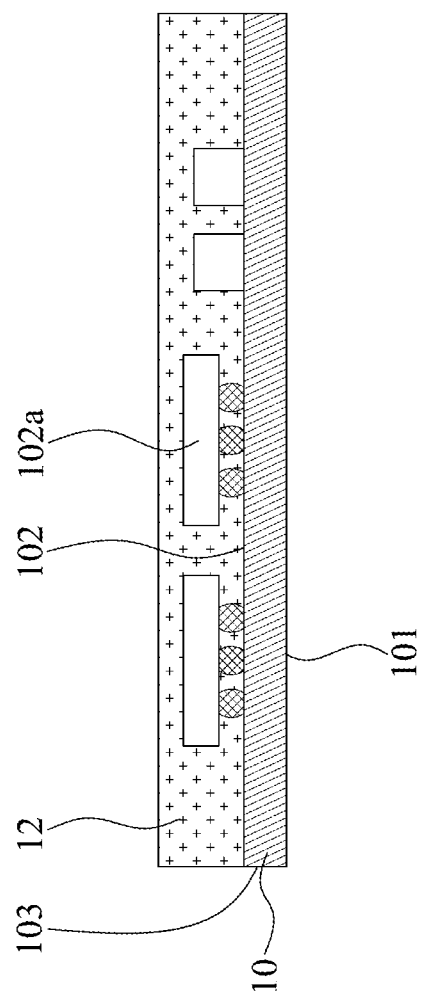
Figure 7C:
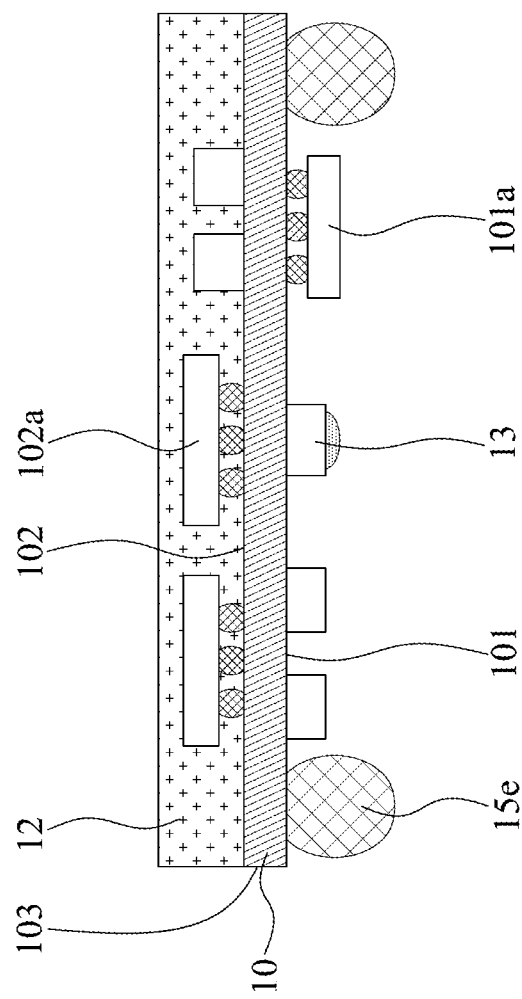
Figure 7D:
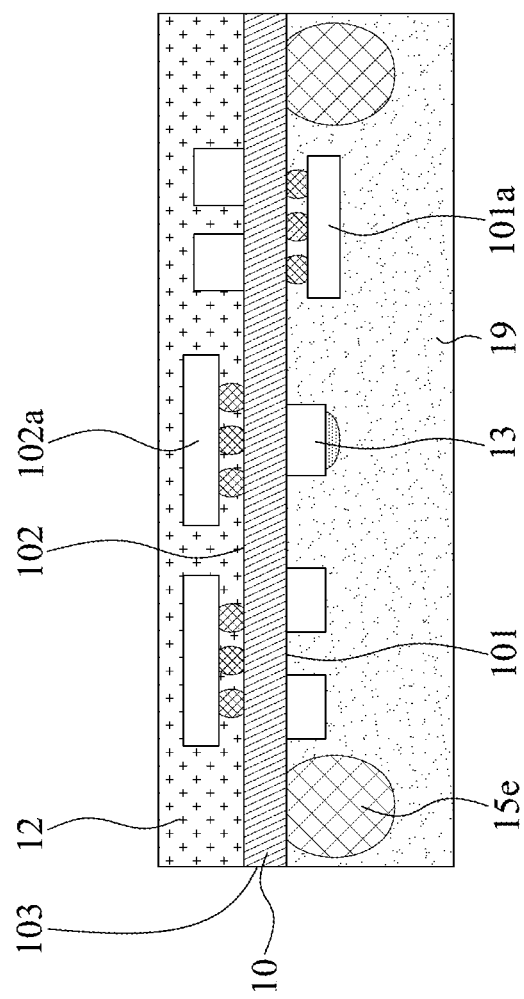
Figure 7E:
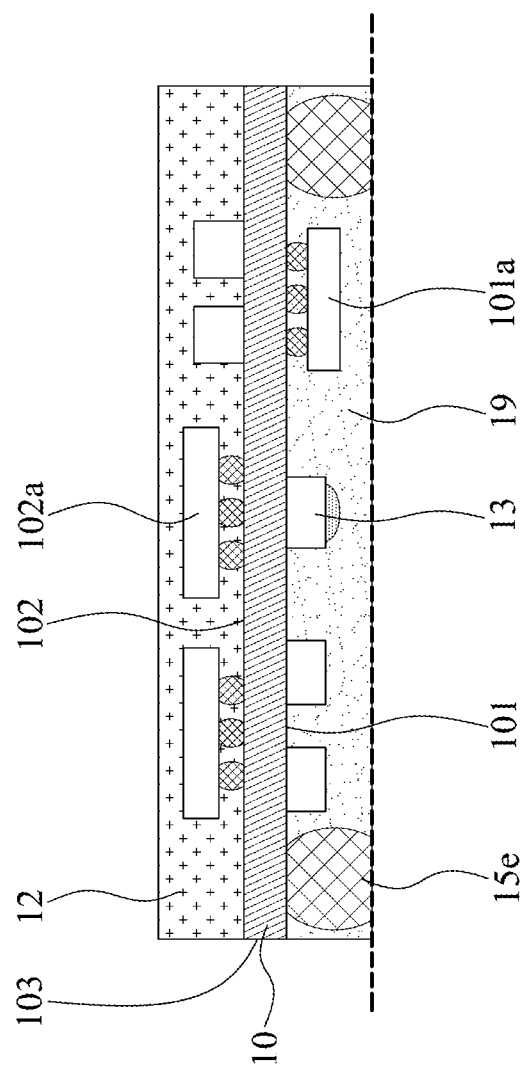
Figure 7F:
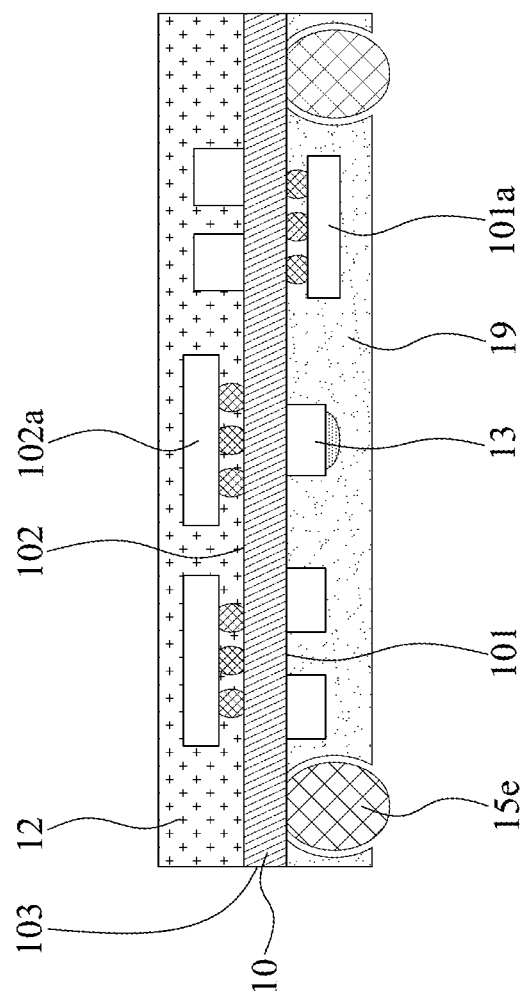

In some embodiments, the encapsulant 19 may be spaced apart from the connector 15e due to a reflow operation or a reballing operation (such as the operation shown in FIG. 7F).

Figure 1H:
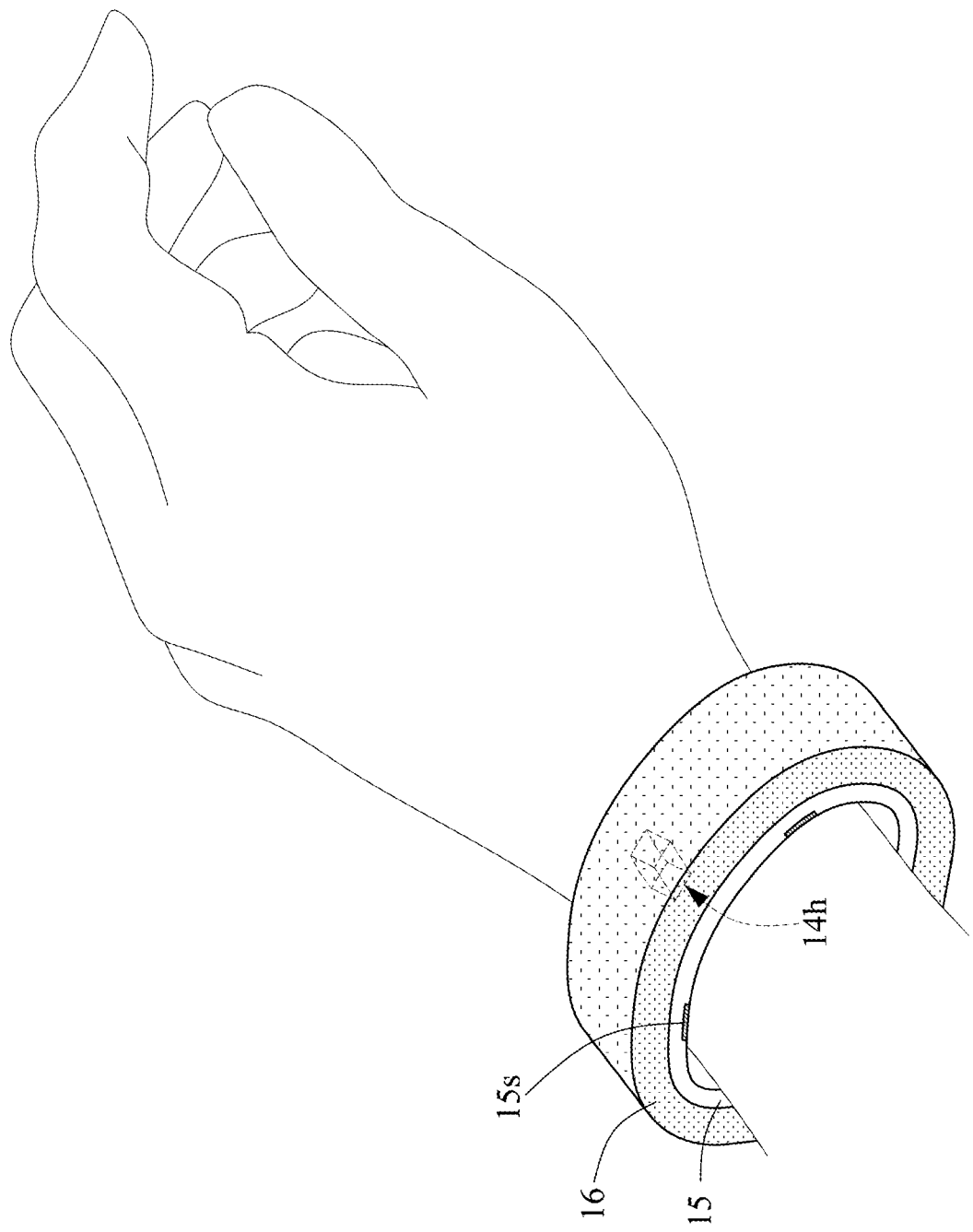
FIG. 1H illustrates a perspective view of a wearable device worn on a wrist in accordance with some embodiments of the present disclosure.

FIG. 1H illustrates a perspective view of a wearable device worn on a wrist in accordance with some embodiments of the present disclosure. In some embodiments, the wearable device may include any one of the electronic packages described.

The adjustable carrier 15 and the encapsulant 16 may be bent. The sensing element 15s may contact the wrist. The space 14h defined by the protection layer (such as the protection layer 14 shown in FIG. 1A) may face the wrist and exposing the sensing device (such as the device 13 shown in FIG. 1A).

FIGS. 2A, 2B, 2C, and 2D illustrate top views of electronic packages in accordance with some embodiments of the present disclosure. In some embodiments, the electronic packages 1a through 1g may have a top view as shown in FIGS. 2A, 2B, 2C, and 2D.

Figure 2A:
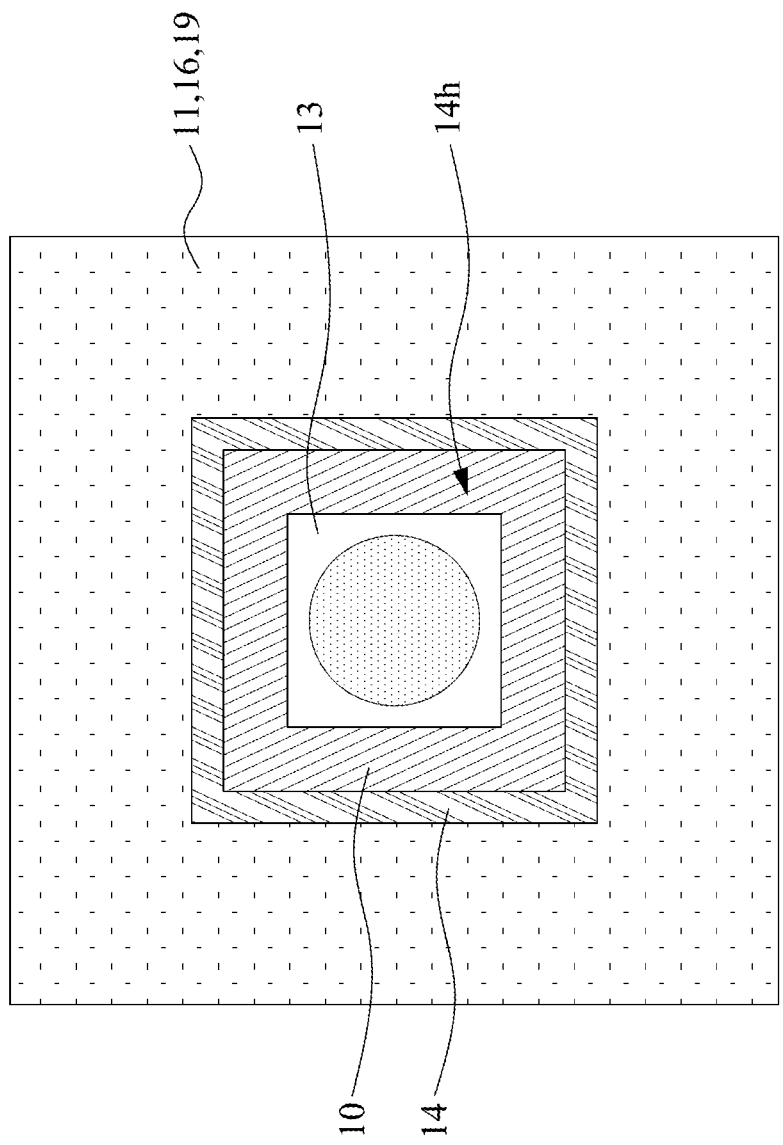
FIG. 2A illustrates a top view of an electronic package in accordance with some embodiments of the present disclosure.

Referring to FIG. 2A, the protection layer 14 may have a rectangular shape. In other words, the space 14h defined by the protection layer 14 may have a rectangular shape. The protection layer 14 may be configured to physically separate the device 13 from an encapsulant (such as the encapsulant 16 in FIGS. 1A, 1B, 1C, 1D, the encapsulant 11 shown in FIGS. 1E, 1F, or the encapsulant 19 shown in FIG. 1G) and to expose an active area (e.g., an emitting region and/or a sensing region) of the device 13. The protection layer 14 may fully surround the lateral surfaces of the device 13.

Figure 2B:
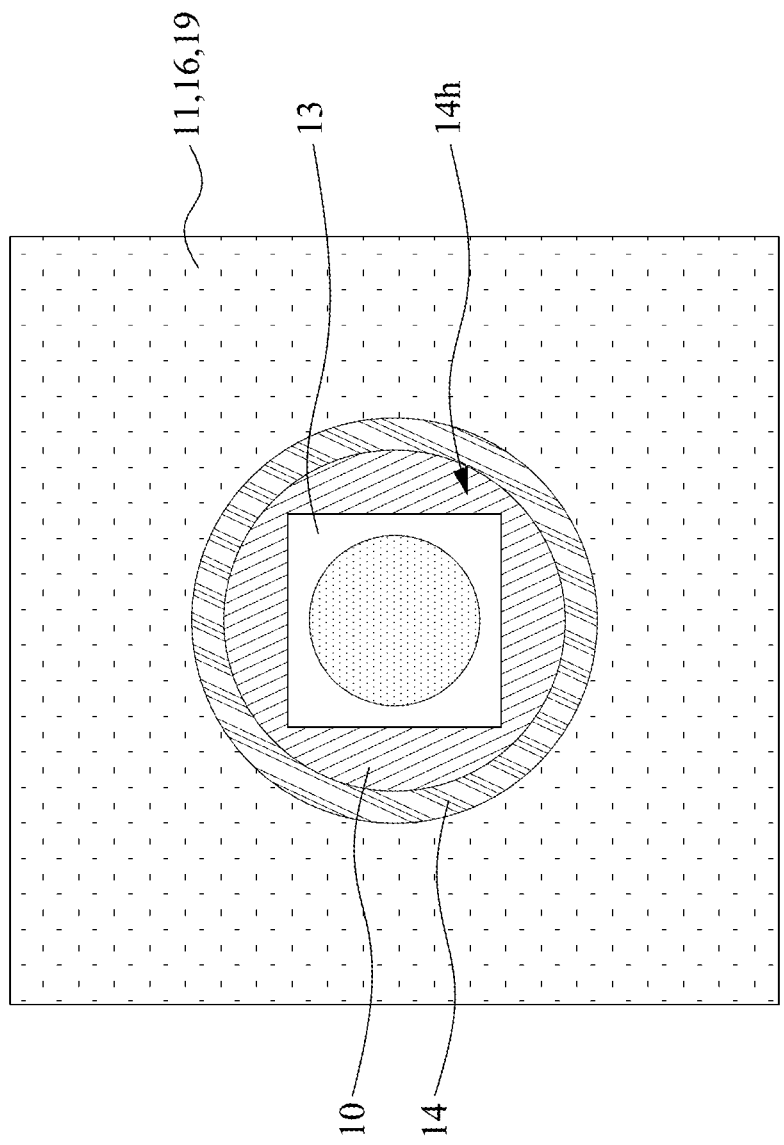
FIG. 2B illustrates a top view of an electronic package in accordance with some embodiments of the present disclosure.

Referring to FIG. 2B, the protection layer 14 may have a circular or elliptical shape. The shape of the protection layer 14 may be adjusted according to design requirements and is not intended to limit the present disclosure.

Referring to FIG. 2C, as mentioned, the device 13 may include one or more transmitters (such as an optical transmitter, or light-emitting diode (LED)), one or more receivers (such as an optical receiver or a photodiode (PD)), or a combination thereof. In FIG. 2C, the device 13 may include three transmitters (i.e., TX) and one receiver (i.e., RX). The relative positions among the transmitters and the receiver may be adjusted according to design requirements and are not intended to limit the present disclosure.

In some embodiments, the transmitters and the receiver may be exposed from the same space 14h. In some other embodiments, the transmitters and the receiver may be exposed from multiple different spaces defined by the protection layer 14.

In some embodiments, a protection layer 141 (which may include an opaque material or an opaque layer) may be disposed between the transmitters and the receiver to avoid crosstalk therebetween. For example, the protection layer 141 may be configured to isolate the transmitters from the receiver. For example, the protection layer 141 may be configured to prevent the light radiated from the transmitter(s) directly entering the receiver. For example, the protection layer 141 may be configured to reduce light leakage. In some embodiments, the protection layer 141 may include a shielding layer. In some embodiments, the protection layer 141 may be connected with the protection layer 14. The protection layer 141 and the protection layer 14 may be disposed on the surface 101 of the substrate 10 (as shown in FIG. 3C). Then, the protection layer 141 and the protection layer 14 may be separated by, for example, laser cutting technology (as shown in FIG. 3F).

Figure 2D:
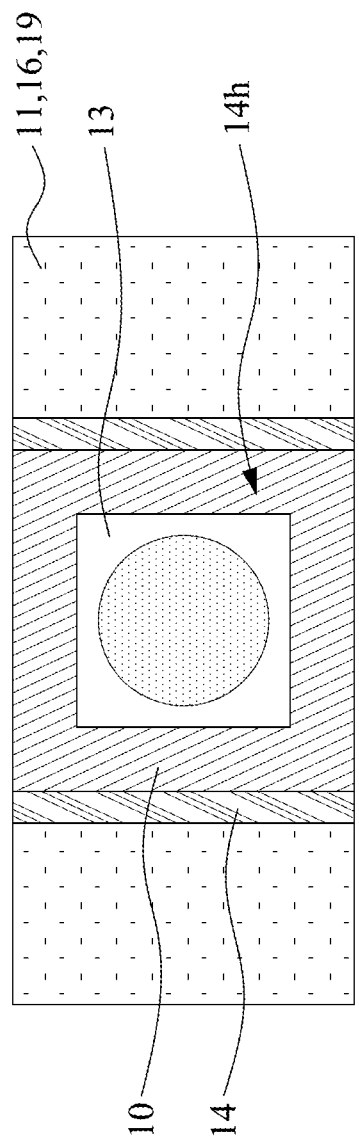
FIG. 2D illustrates a top view of an electronic package in accordance with some embodiments of the present disclosure.

Referring to FIG. 2D, the protection layer 14 may only surround two lateral surfaces of the device 13. In some embodiments, before the substrate 10 is mounted on the adjustable carrier 15, the substrate 10 and the protection layer 14 may be cut or singulated to form a plurality of separate units. Therefore, one or more sidewalls of the protection layer 14 may be removed. In some embodiments, a shielding layer may be formed to fully surround lateral surfaces of the device 13 with the remaining protection layer 14.

FIG. 3A, FIG. 3B, FIG. 3C, FIG. 3D, FIG. 3E, FIG. 3F, and FIG. 3G illustrate cross-sectional views in one or more stages of a method of manufacturing an electronic package in accordance with an embodiment of the present disclosure. At least some of these figures have been simplified to better understand the aspects of the present disclosure. In some embodiments, the electronic package 1a may be manufactured through the operations described with respect to FIG. 3A, FIG. 3B, FIG. 3C, FIG. 3D, FIG. 3E, FIG. 3F, and FIG. 3G.

Figure 3A:
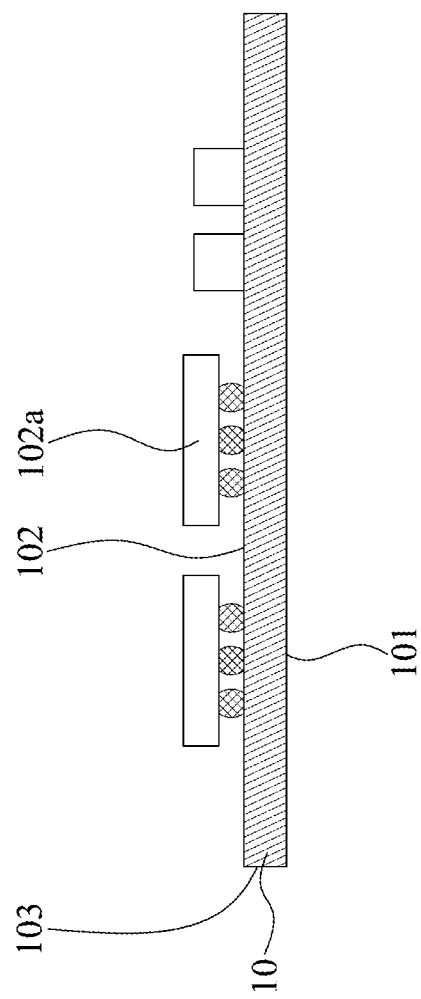
FIG. 3A, FIG. 3B, FIG. 3C, FIG. 3D, FIG. 3E, FIG. 3F, and FIG. 3G illustrate cross-sectional views in one or more stages of a method of manufacturing an electronic package in accordance with an embodiment of the present disclosure.

Referring to FIG. 3A, the substrate 10 may be provided. The substrate 10 may include the surface 101 and the surface 102 opposite to the surface 101. The device 102a may be disposed on the surface 102 of the substrate 10.

Figure 3B:
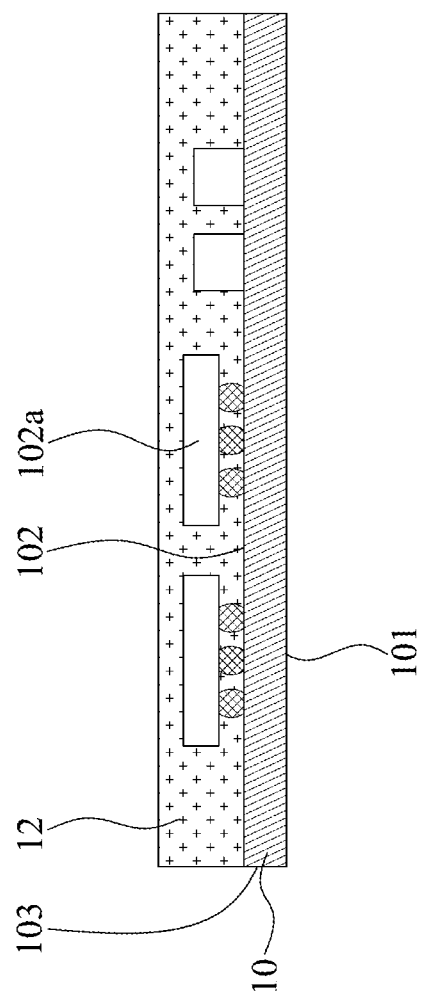
Figure 3C:
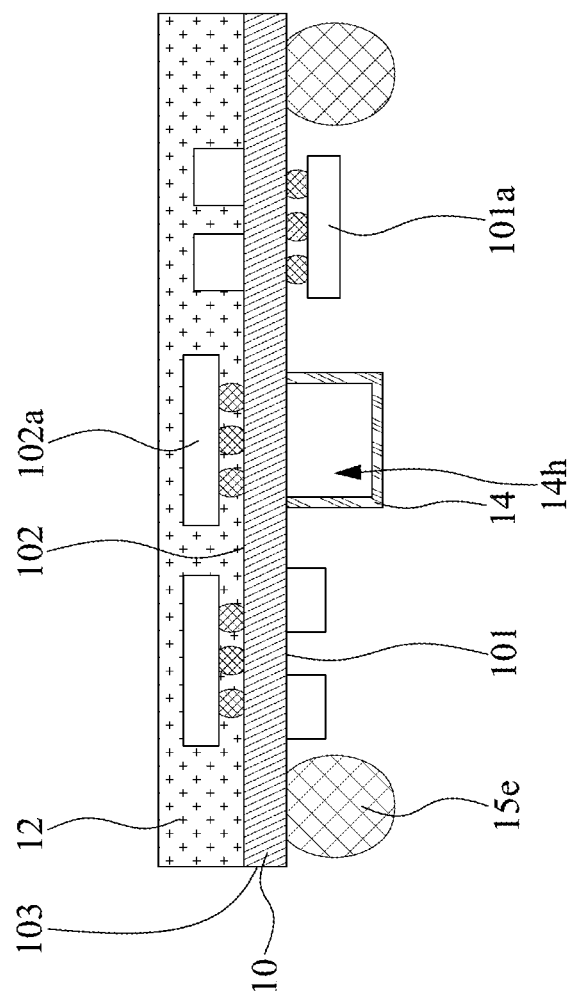

Referring to FIG. 3B, the encapsulant 12 may be disposed on the surface 102 of the substrate 10 to cover the device 102a. In some embodiments, the encapsulant 12 may be formed by a molding technique, such as transfer molding or compression molding.

Referring to FIG. 3C, the connector 15e, the protection layer 14 (and the protection layer 141, if any), and the device 101a may be disposed on the surface 101 of the substrate 10. The protection layer 14 may define the space 14h to accommodate the device 13 in the following operations.

Figure 3D:
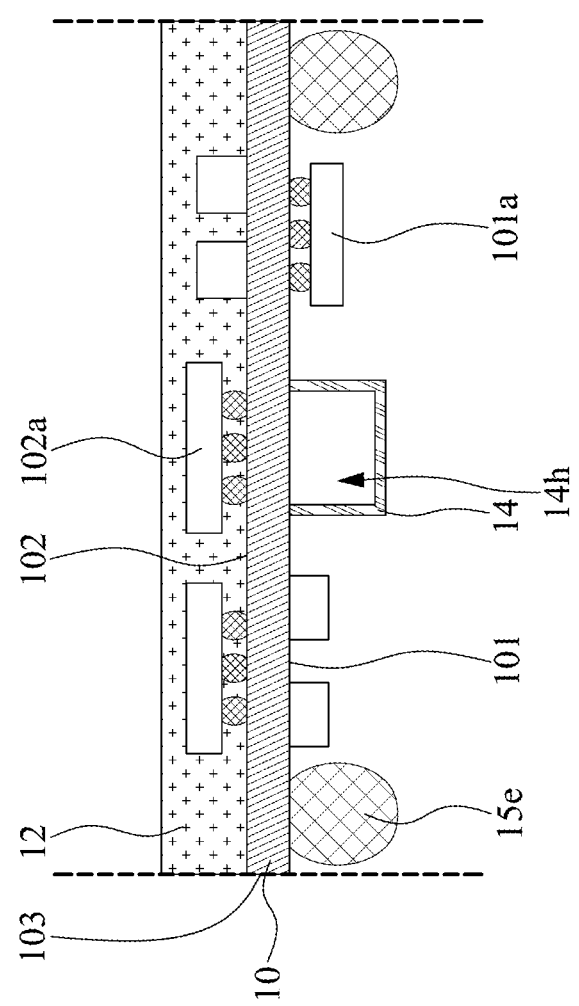
Figure 3E:
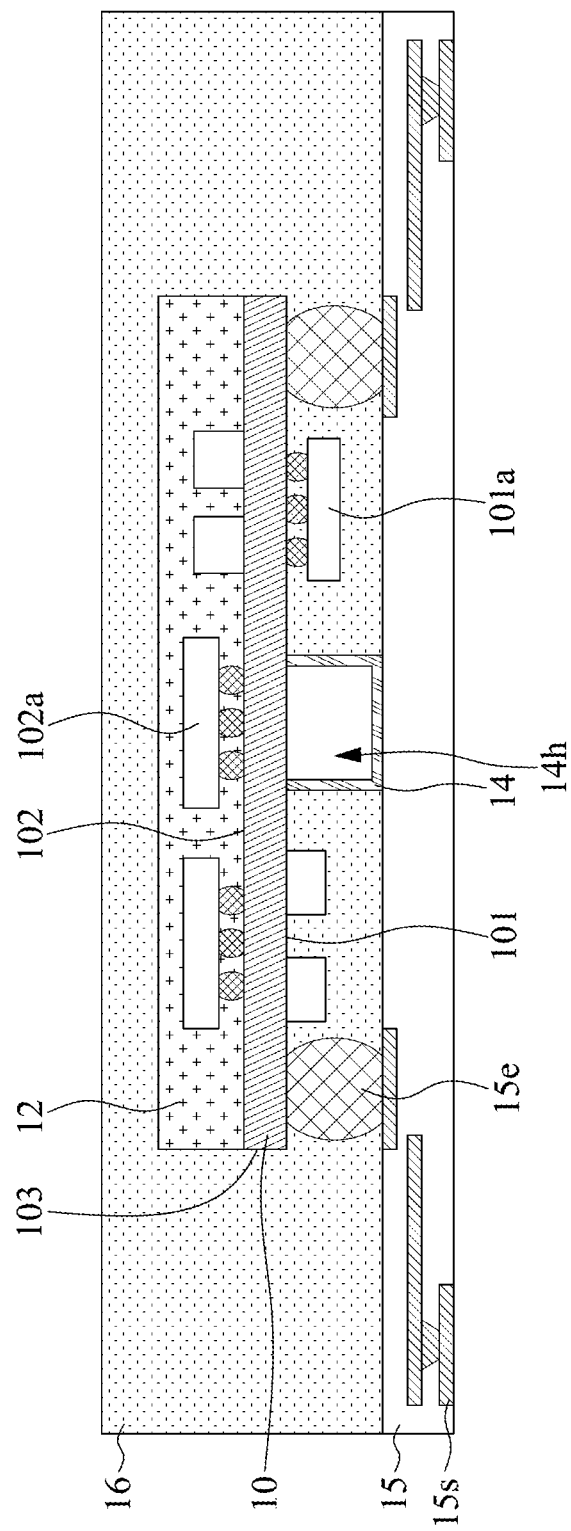
Figure 3F:
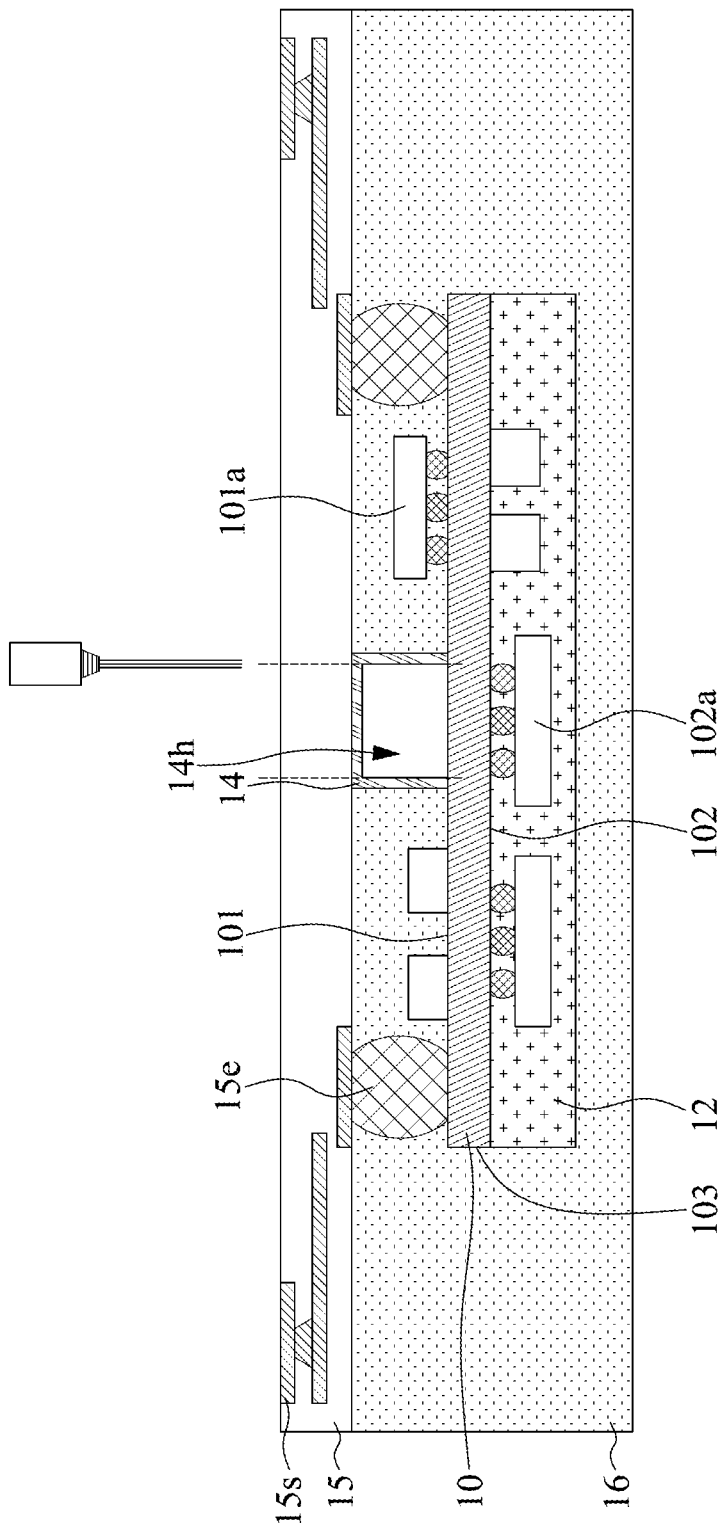

Referring to FIG. 3D, a singulation may be performed to separate out individual semiconductor package devices. The singulation may be performed, for example, by using a dicing saw, laser or other appropriate cutting techniques.

Referring to FIG. 3E, the individual semiconductor package device obtained from the operation in FIG. 3D may be attached to the adjustable carrier 15 through the connector 15e. In some embodiments, the protection layer 14 may define the distance between the substrate 10 and the adjustable carrier 15 and enhance the process capability. For example, the protection layer 14 may contact the adjustable carrier 15.

The encapsulant 16 may be disposed on the adjustable carrier 15 to cover the encapsulant 12, the substrate 10, and the connector 15e. In some embodiments, the encapsulant 16 may be formed by a molding technique, such as transfer molding or compression molding.

Referring to FIG. 3F, a portion of the protection layer 14 may be removed to expose the space 14h. In addition, a portion of the adjustable carrier 15 may be removed to form a through hole of the adjustable carrier 15. In some embodiments, the portion of the protection layer 14 and the portion of the adjustable carrier 15 may be removed by, for example, laser cutting technology. In some embodiments, the portion of the protection layer 14 and the portion of the adjustable carrier 15 may be removed in the same operation. In some embodiments, the cutting surfaces of the protection layer 14 and the adjustable carrier 15 may be substantially coplanar.

Figure 3G:
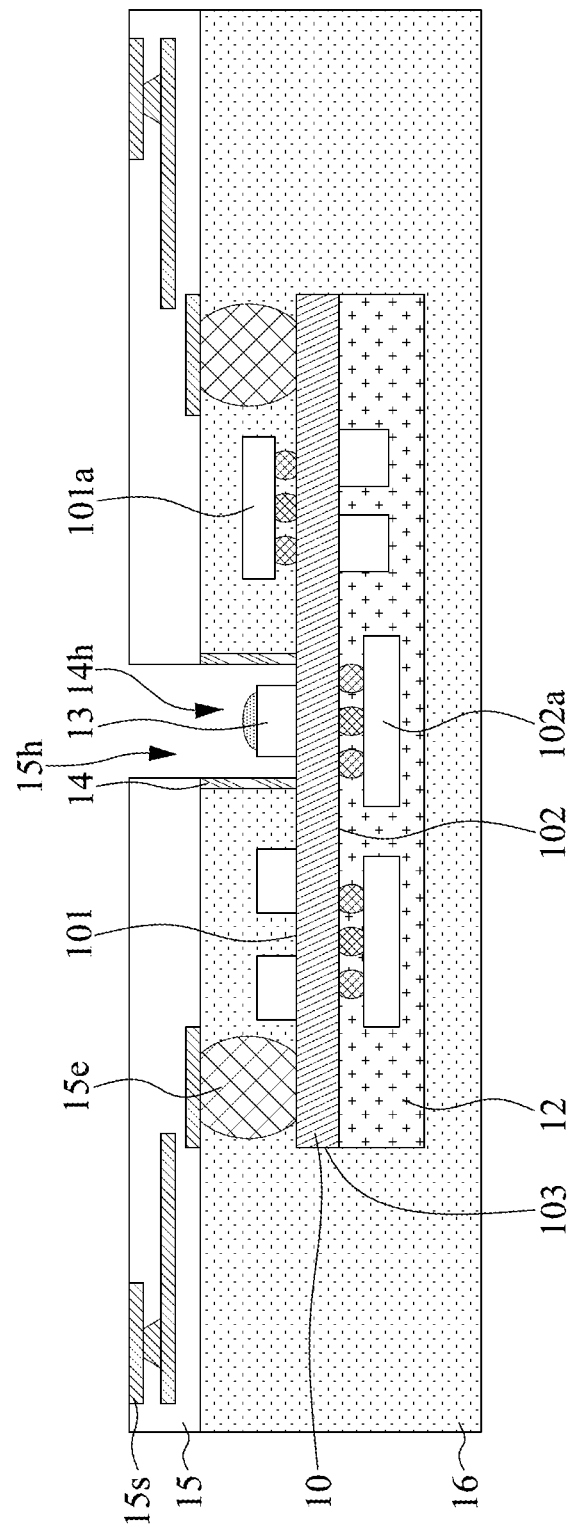

Referring to FIG. 3G, the device 13 may be disposed in the space 14h. An active area (e.g., an emitting region and/or a sensing region) of the device 13 may be exposed from the protection layer 14. In some embodiments, the active area of the device 13 may be exposed through the through hole 15h of the adjustable carrier 15.

The structure obtained from the operation in FIG. 3G may be similar to the electronic package 1a. In some embodiments, the height of the device 13 may be adjusted according to design requirements and is not intended to limit the present disclosure. For example, the device 13 may at least partially extend within the through hole 15h of the adjustable carrier 15, as shown in FIG. 1B. In some embodiments, a light transmissive material (such as an optical structure or a gel) may be provided, as shown in FIG. 1C and FIG. 1D.

In the operations described with respect to FIG. 3A, FIG. 3B, FIG. 3C, FIG. 3D, FIG. 3E, FIG. 3F, and FIG. 3G, device 13 is disposed in the space 14h after a portion of the protection layer 14 is removed.

Figure 4A:
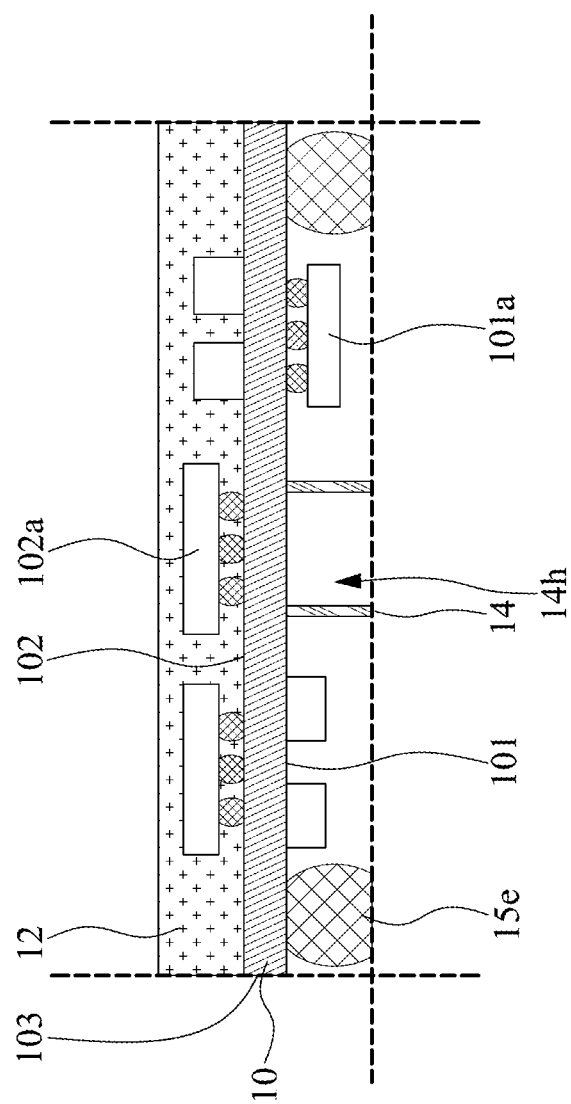
FIG. 4A and FIG. 4B illustrate cross-sectional views in one or more stages of a method of manufacturing an electronic package in accordance with an embodiment of the present disclosure.
Figure 4B:
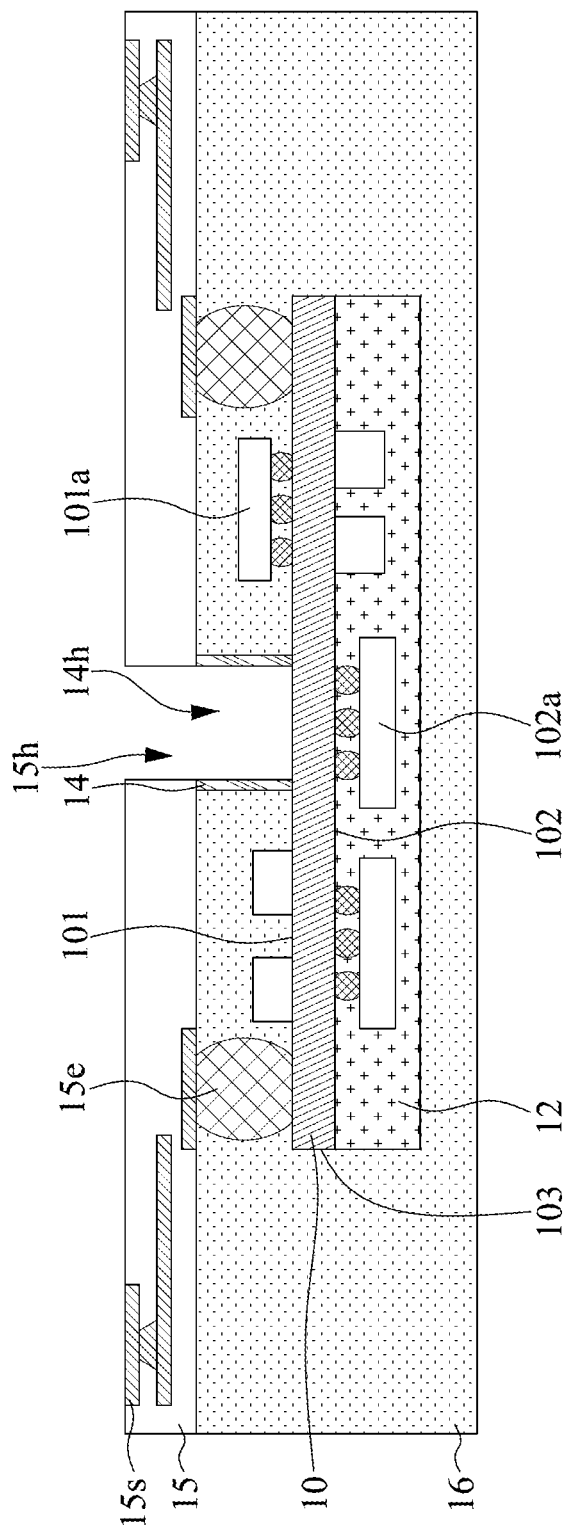
Figure 5A:
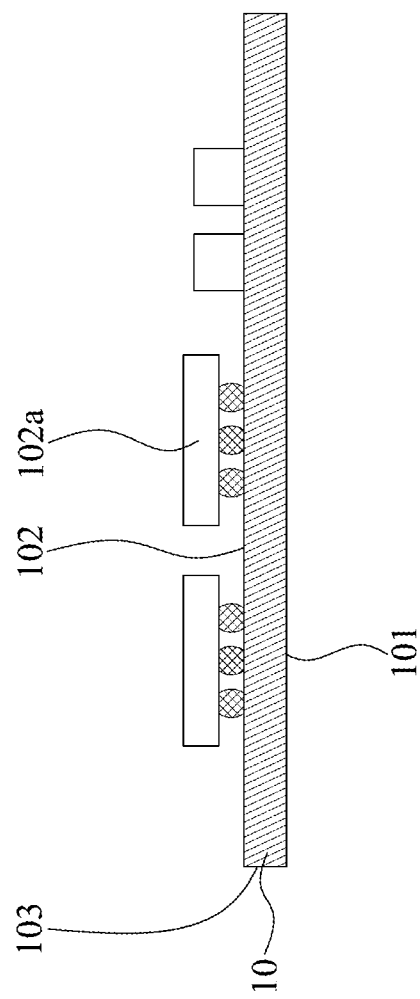
FIG. 5A, FIG. 5B, FIG. 5C, FIG. 5D, FIG. 5E, FIG. 5F, and FIG. 5G illustrate cross-sectional views in one or more stages of a method of manufacturing an electronic package in accordance with an embodiment of the present disclosure.
Figure 5B:
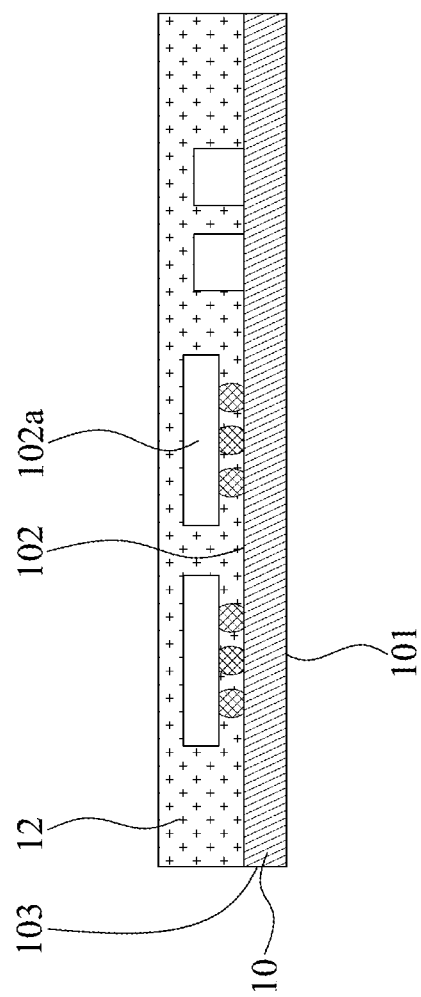
Figure 5C:
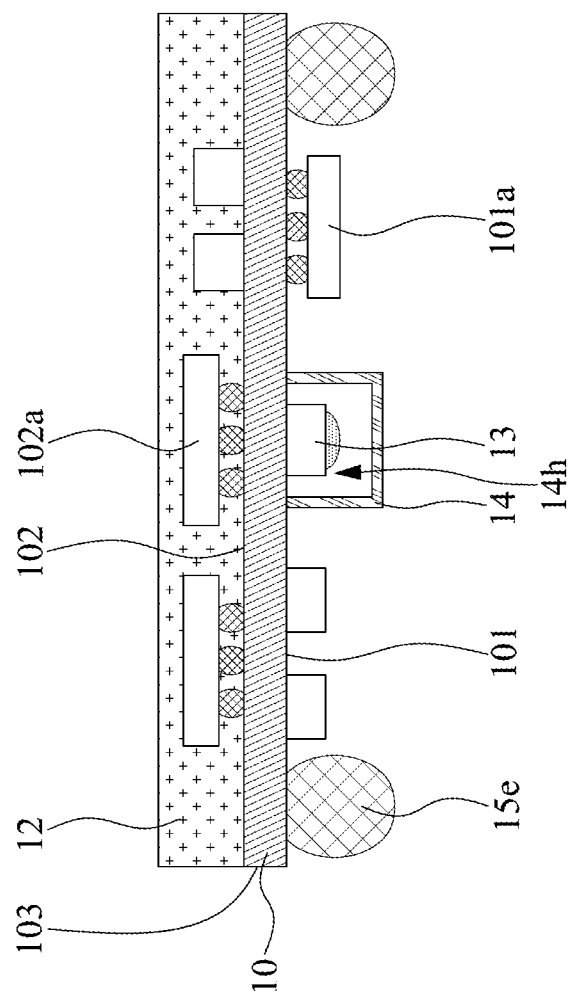
Figure 5D:
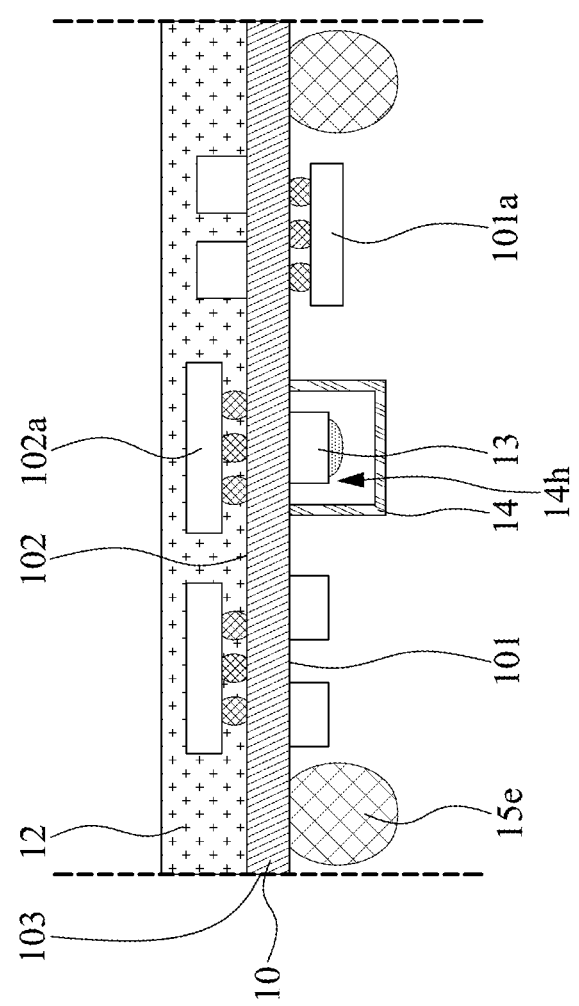
Figure 5E:
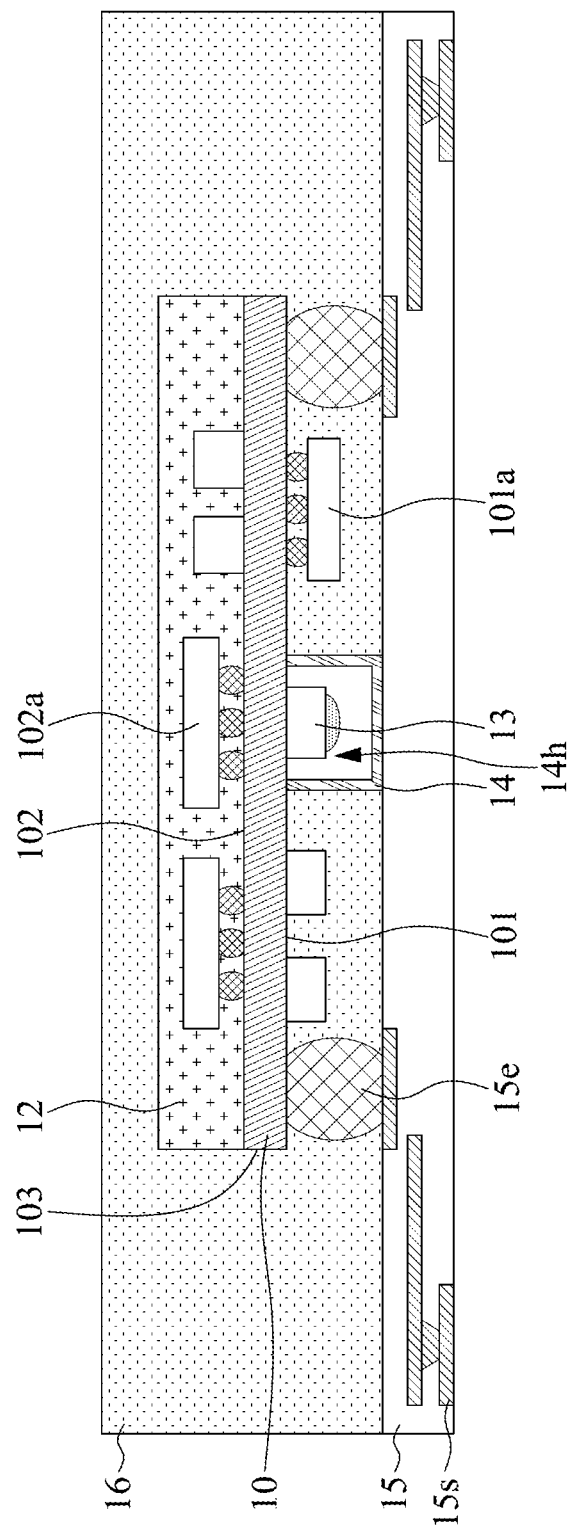
Figure 5F:
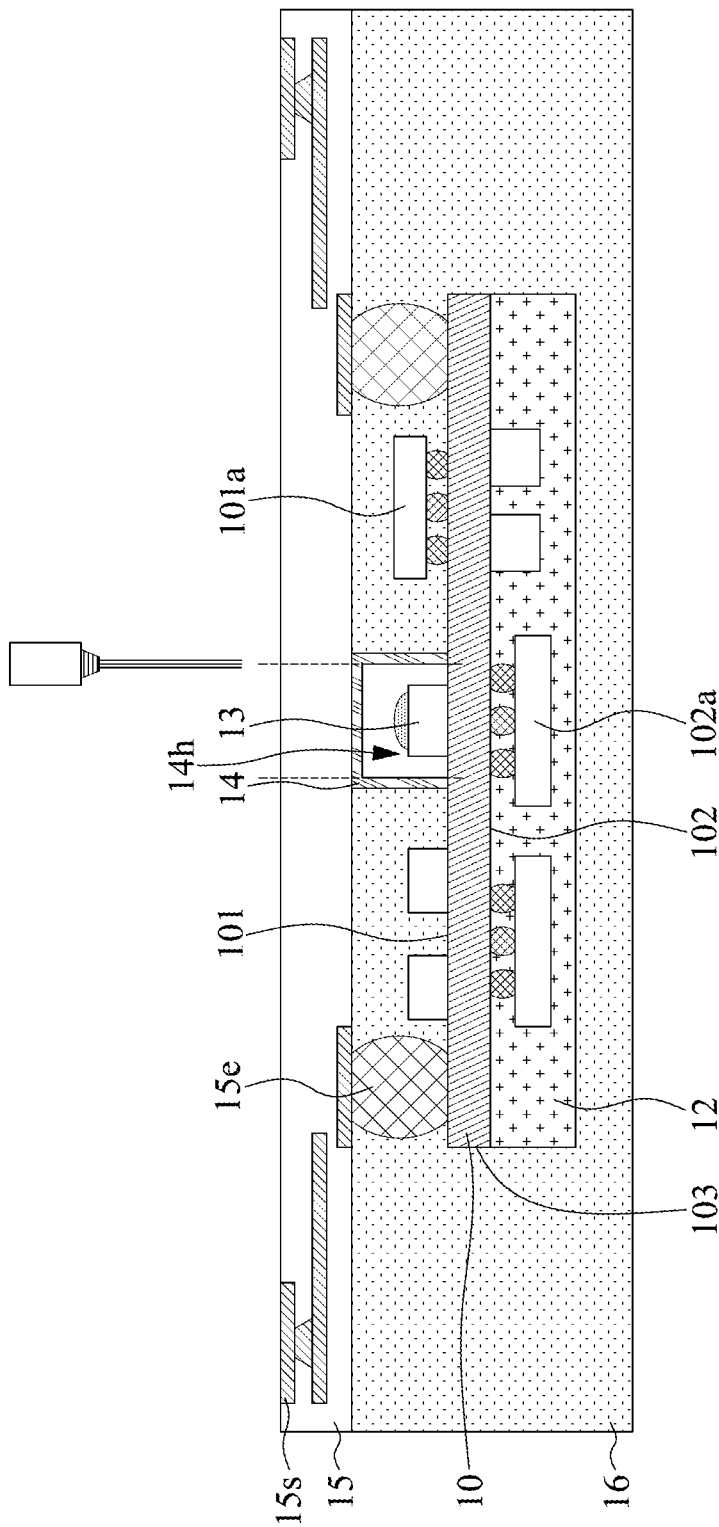
Figure 5G:
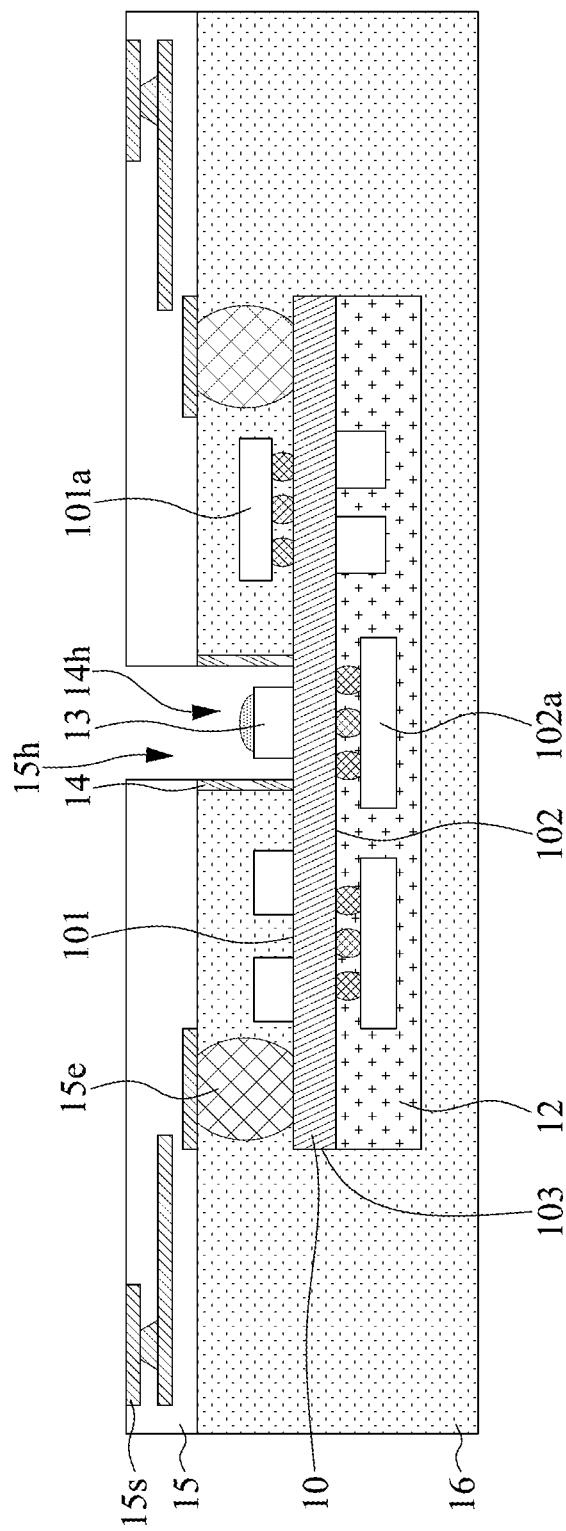

FIG. 4A and FIG. 4B illustrate cross-sectional views in one or more stages of a method of manufacturing an electronic package in accordance with an embodiment of the present disclosure. Operations in FIG. 4A and FIG. 4B may be subsequent to the operation in FIG. 3C and before the operation in FIG. 3G. In some embodiments, the electronic package 1a may be manufactured through the operations described with respect to FIG. 3A, FIG. 3B, FIG. 3C, FIG. 4A, FIG. 4B, and FIG. 3G.

Referring to FIG. 4A, the operations in FIG. 4A may be subsequent to the operation in FIG. 3C. A singulation may be performed to separate out individual semiconductor package devices. The singulation may be performed, for example, by using a dicing saw, laser or other appropriate cutting techniques.

In addition, a grinding operation may be performed to remove a portion of the protection layer 14. The grinding operation may be an abrasive machining process that uses a grinding wheel or grinder as the cutting tool. After the grinding operation, the top portion of the protection layer 14 may be removed, leaving one or more sidewalls of the protection layer 14 on the substrate 10. The space 14h may be exposed.

Referring to FIG. 4B, the individual semiconductor package device obtained from the operation in FIG. 4A may be attached to the adjustable carrier 15 through the connector 15e.

The through hole 15h of the adjustable carrier 15 may be formed before the individual semiconductor package device obtained from the operation in FIG. 4A be attached to the adjustable carrier 15 through the connector 15e. The encapsulant 16 may be disposed on the adjustable carrier 15 to cover the encapsulant 12, the substrate 10, and the connector 15e. In some embodiments, the encapsulant 16 may be formed by a molding technique, such as transfer molding or compression molding. Then, the device 13 may be disposed in the space 14h. The final structure may be similar to the electronic package 1a.

FIG. 5A, FIG. 5B, FIG. 5C, FIG. 5D, FIG. 5E, FIG. 5F, and FIG. 5G illustrate cross-sectional views in one or more stages of a method of manufacturing an electronic package in accordance with an embodiment of the present disclosure. At least some of these figures have been simplified to better understand the aspects of the present disclosure. In some embodiments, the electronic packages 1a may be manufactured through the operations described with respect to FIG. 5A, FIG. 5B, FIG. 5C, FIG. 5D, FIG. 5E, FIG. 5F, and FIG. 5G.

The operations in FIG. 5A, FIG. 5B, FIG. 5C, FIG. 5D, FIG. 5E, FIG. 5F, and FIG. 5G may be similar to the operations in FIG. 3A, FIG. 3B, FIG. 3C, FIG. 3D, FIG. 3E, FIG. 3F, and FIG. 3G except that the device 13 is disposed on the surface 102 of the substrate 10 and in the space 14h before a portion of the protection layer 14 is removed.

FIG. 6A, FIG. 6B, FIG. 6C, FIG. 6D, FIG. 6E, and FIG. 6F illustrate cross-sectional views in one or more stages of a method of manufacturing an electronic package in accordance with an embodiment of the present disclosure. Operations in FIG. 6A, FIG. 6B, FIG. 6C, FIG. 6D, FIG. 6E, and FIG. 6F may be subsequent to the operation in FIG. 3C. In some embodiments, the electronic package 1e may be manufactured through the operations described with respect to FIG. 6A, FIG. 6B, FIG. 6C, FIG. 6D, FIG. 6E, and FIG. 6F.

Referring to FIG. 6A, the encapsulant 11 may be disposed on the surface 101 of the substrate 10 to cover the connector 15e, the protection layer 14, and the device 101a. In some embodiments, the encapsulant 11 may be formed by a molding technique, such as transfer molding or compression molding. In some embodiments, the encapsulant 11 may not be present in the space 14h defined by the protection layer 14.

Referring to FIG. 6B, a grinding operation may be performed to remove a portion of the encapsulant 11 and the connector 15e.

Referring to FIG. 6C, a reflow operation or a reballing operation may be performed. Therefore, a gap may be formed between the encapsulant 11 and the connector 15e.

Figure 6D:
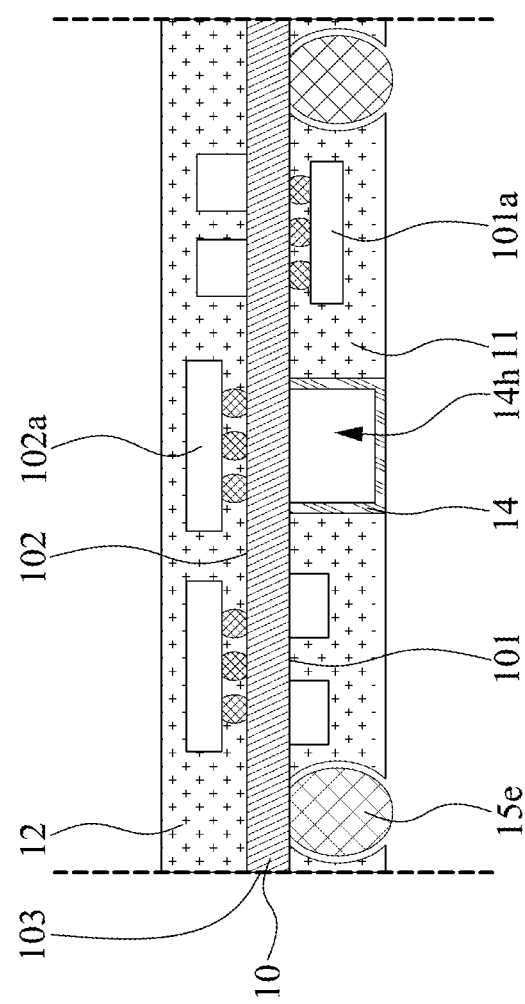

Referring to FIG. 6D, a singulation may be performed to separate out individual semiconductor package devices. The singulation may be performed, for example, by using a dicing saw, laser or other appropriate cutting techniques.

Figure 6E:
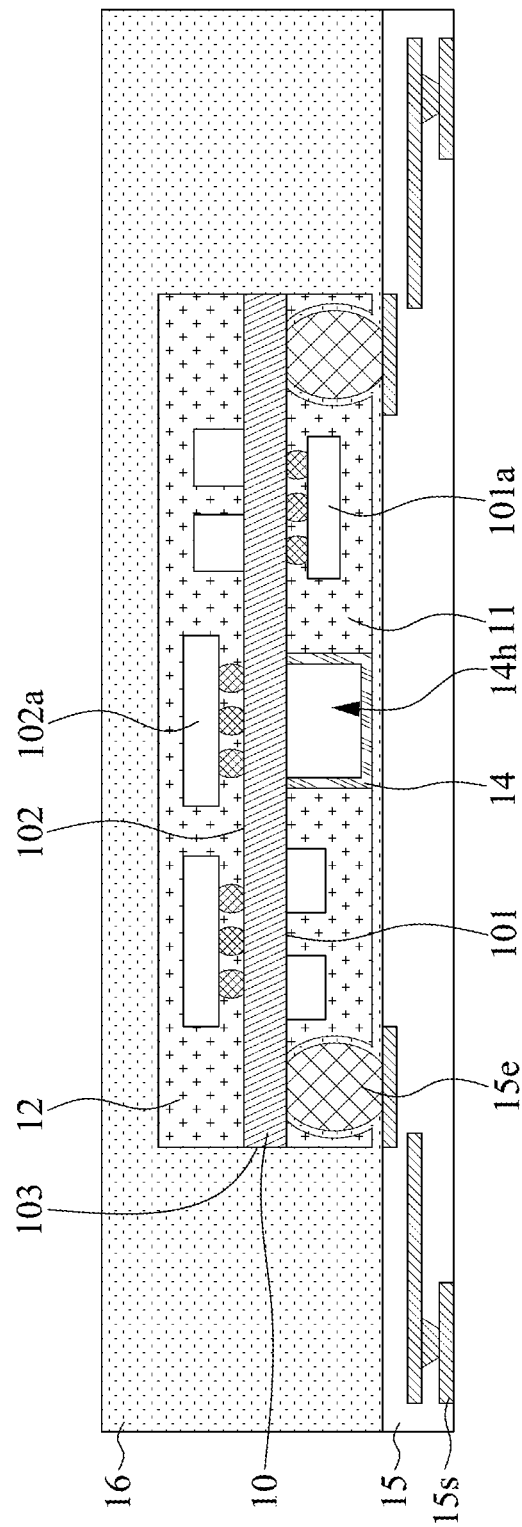

Referring to FIG. 6E, the individual semiconductor package device obtained from the operation in FIG. 6D may be attached to the adjustable carrier 15 through the connector 15e.

The encapsulant 16 may be disposed on the adjustable carrier 15 to cover the encapsulant 12, the substrate 10, and the connector 15e. In some embodiments, the encapsulant 16 may be formed by a molding technique, such as transfer molding or compression molding.

The encapsulant 11 may be spaced apart from the adjustable carrier 15. However, in other some embodiments, the encapsulant 11 may define the distance between the substrate 10 and the adjustable carrier 15 and enhance the process capability. For example, the encapsulant 11 may contact the adjustable carrier 15.

Figure 6F:
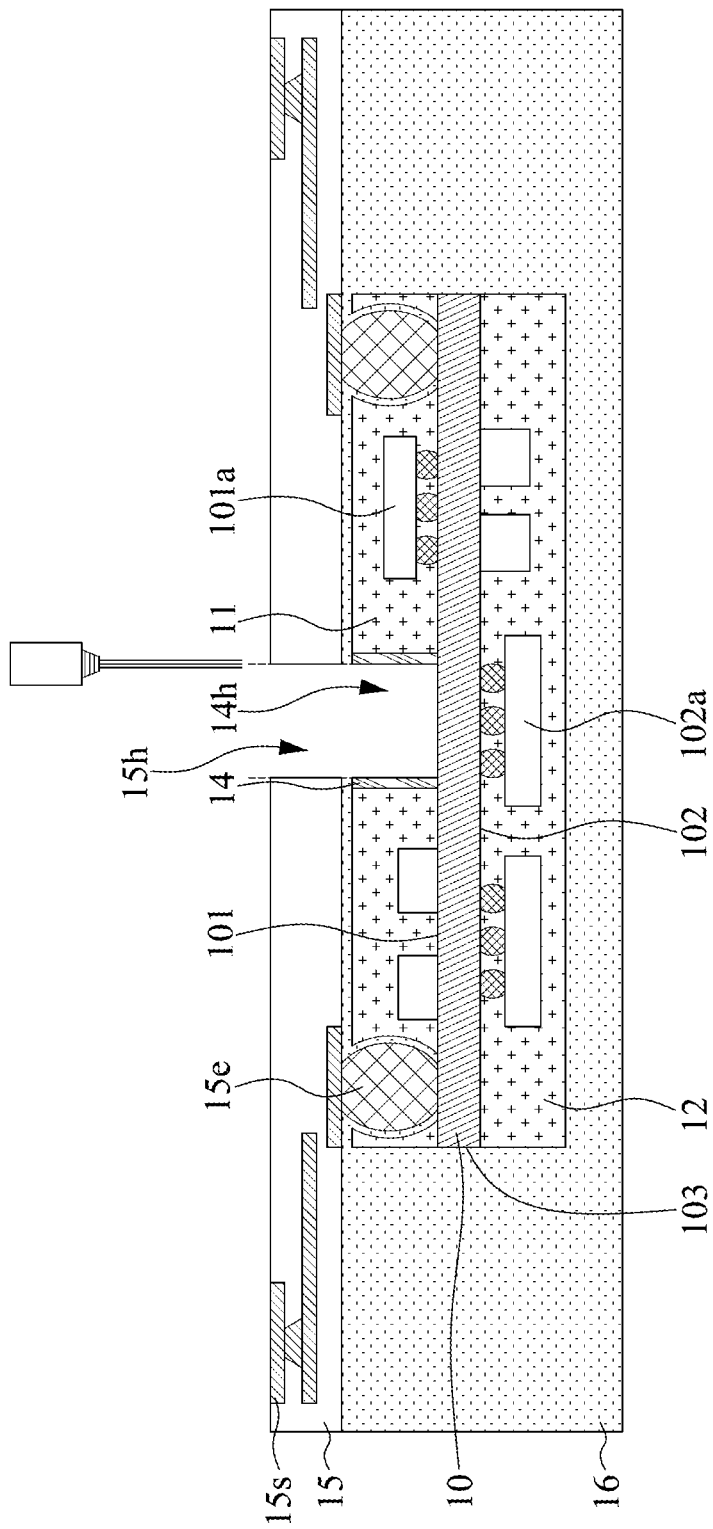

Referring to FIG. 6F, a portion of the protection layer 14 may be removed to expose the space 14h. In addition, a portion of the adjustable carrier 15 may be removed to form the through hole 15h of the adjustable carrier 15. In some embodiments, the portion of the protection layer 14 and the portion of the adjustable carrier 15 may be removed by, for example, laser cutting technology. In some embodiments, the portion of the protection layer 14 and the portion of the adjustable carrier 15 may be removed in the same operation. In some embodiments, the cutting surfaces of the protection layer 14 and the adjustable carrier 15 may be substantially coplanar.

Then, the device 13 may be disposed in the space 14h. The structure obtained from the operation in FIG. 6F may be similar to the electronic package 1e. In some embodiments, a light transmissive material (such as an optical structure or a gel) may be provided, as shown in FIG. 1C and FIG. 1D.

In some embodiments, a grinding operation may be performed to remove the top portion of the protection layer 14 before the operation in FIG. 6E. In some embodiments, the through hole 15h of the adjustable carrier 15 may be preformed. Similar descriptions may refer to the operation in FIG. 4A and FIG. 4B, and are not repeated hereafter.

In some embodiments, the device 13 is disposed on the surface 102 of the substrate 10 and in the space 14h before a portion of the protection layer 14 is removed. Since the protection layer 14 covers the device 13, the encapsulant 11 may cover the protection layer 14 without contacting the device 13. Similar descriptions may refer to the operation in FIG. 5A, FIG. 5B, FIG. 5C, FIG. 5D, FIG. 5E, FIG. 5F, and FIG. 5G, and are not repeated hereafter.

FIG. 7A, FIG. 7B, FIG. 7C, FIG. 7D, FIG. 7E, FIG. 7F, FIG. 7G, and 7H illustrate cross-sectional views in one or more stages of a method of manufacturing an electronic package in accordance with an embodiment of the present disclosure. At least some of these figures have been simplified to better understand the aspects of the present disclosure. In some embodiments, the electronic package 1g may be manufactured through the operations described with respect to FIG. 7A, FIG. 7B, FIG. 7C, FIG. 7D, FIG. 7E, FIG. 7F, FIG. 7G, and 7H.

Referring to FIG. 7A, the substrate 10 may be provided. The substrate 10 may include the surface 101 and the surface 102 opposite to the surface 101. The device 102a may be disposed on the surface 102 of the substrate 10.

Referring to FIG. 7B, the encapsulant 12 may be disposed on the surface 102 of the substrate 10 to cover the device 102a. In some embodiments, the encapsulant 12 may be formed by a molding technique, such as transfer molding or compression molding.

Referring to FIG. 7C, the connector 15*e*, the device 13, and the device 101*a* may be disposed on the surface 101 of the substrate 10. The operation in FIG. 7C may be similar to the operation in FIG. 5C except that the protection layer 14 is omitted in the operation in FIG. 7C.

Referring to FIG. 7D, the encapsulant 19 may be disposed on the surface 101 of the substrate 10 to cover the connector 15*e*, the device 13, and the device 101*a*. In some embodiments, the encapsulant 19 may be formed by a molding technique, such as transfer molding or compression molding.

Referring to FIG. 7E, a grinding operation may be performed to remove a portion of the encapsulant 19.

Referring to FIG. 7F, a reflow operation or a reballing operation may be performed. Therefore, a gap may be formed between the encapsulant 19 and the connector 15*e*.

Figure 7G:
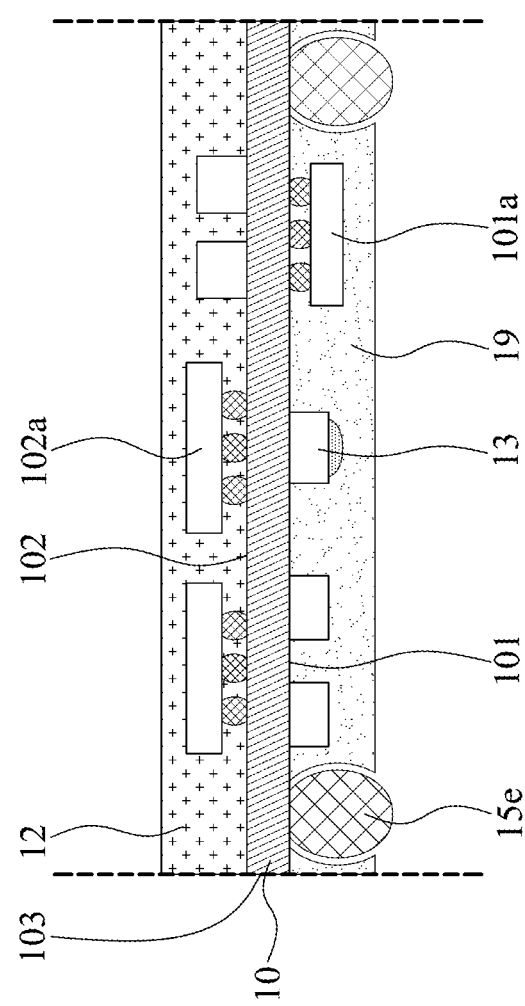

Referring to FIG. 7G, a singulation may be performed to separate out individual semiconductor package devices. The singulation may be performed, for example, by using a dicing saw, laser or other appropriate cutting techniques.

Figure 7H:
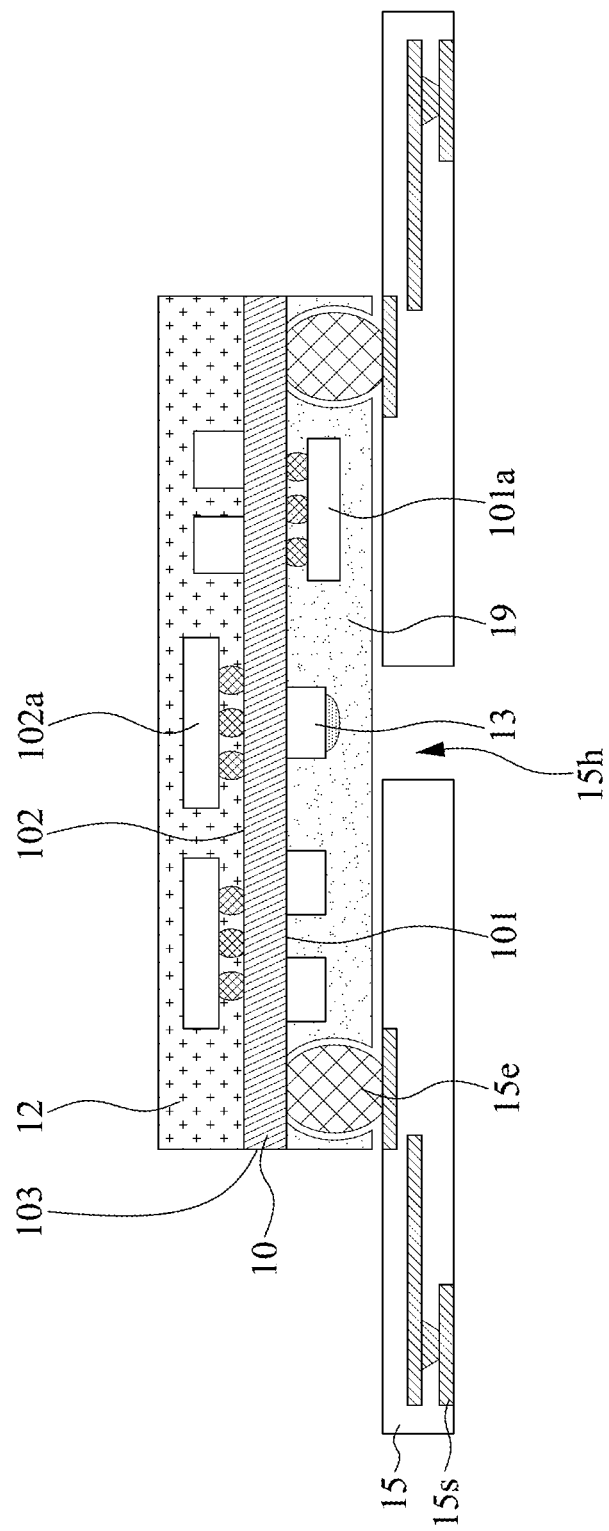

Referring to FIG. 7H, the individual semiconductor package device obtained from the operation in FIG. 7G may be attached to the adjustable carrier 15 through the connector 15*e*. *In some embodiments, the through hole* 15*h of the adjustable carrier* 15 *may be preformed*. In some other embodiments, the through hole 15*h* of the adjustable carrier 15 may be formed after the operation in FIG. 7H by, for example, laser cutting technology.

The structure obtained from the operation in FIG. 7H may be similar to the electronic package 1*g*.

Figure 8A:
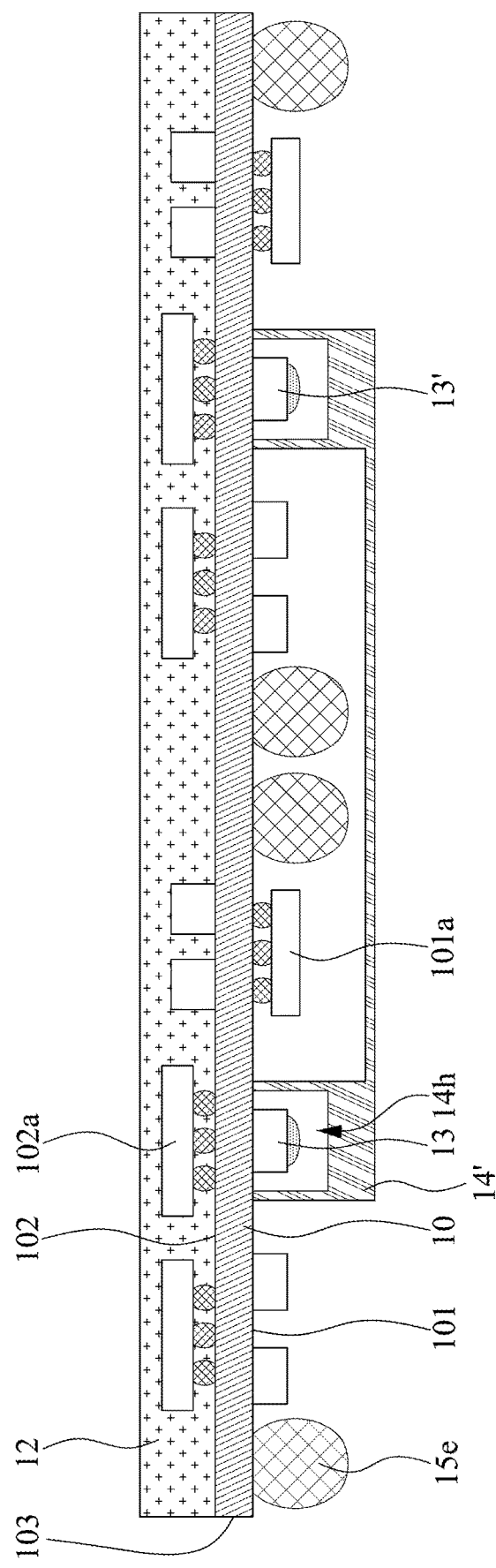
FIG. 8A and FIG. 8B illustrate top views in one or more stages of a method of manufacturing an electronic package in accordance with an embodiment of the present disclosure.
Figure 8B:
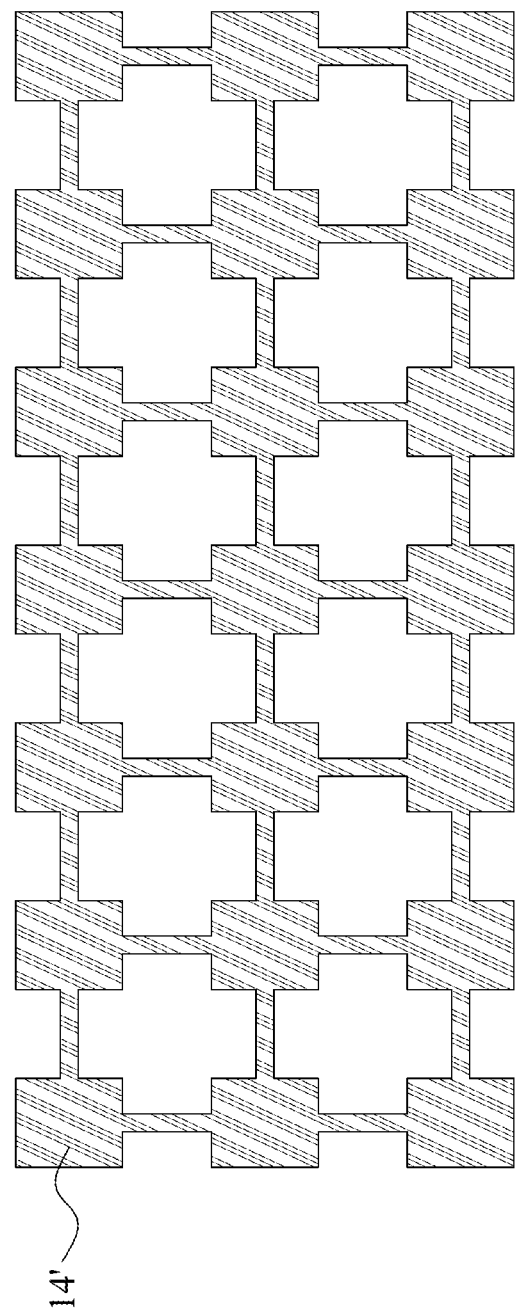

FIG. 8A and FIG. 8B illustrate top views in one or more stages of a method of manufacturing an electronic package in accordance with an embodiment of the present disclosure.

Referring to FIG. 8A, the protection layer 14' may be disposed on the surface 101 of the substrate 10 to cover a plurality of devices (including, but not limited to, the devices 13 and 13').

Referring to FIG. 8B, the protection layer 14' may include a plurality of lids, each of which may define a space to accommodate the devices. The plurality of lids may be connected through a frame structure. In some embodiments, the plurality of lids may be disposed on the surface 101 of the substrate 10 to cover a plurality of devices in one operation. Then, a grinding operation and/or a singulation may be performed to separate out individual protection layers 14.

In some embodiments, the protection layer 14' may be applied in the operations described.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a substrate;
a first component disposed on the substrate and configured to detect an external signal;
an encapsulant disposed on the substrate; and
a protection element disposed on the substrate and physically separating the first component from the encapsulant and exposing the first component,
wherein the first component laterally overlaps the protection element, and the first component is spaced apart from the protection element.

2. The electronic package of claim 1, wherein a portion of the substrate is exposed by the encapsulant.

3. The electronic package of claim 1, wherein a material of the protection element comprises metal.

4. The electronic package of claim 1, wherein the encapsulant comprises a light transmissive material.

5. The electronic package of claim 1, further comprising:
a first chip spaced apart from the first component by the protection element.

6. The electronic package of claim 1, wherein the substrate is covered by the encapsulant, and a width of the substrate is less than a width of the encapsulant.

7. The electronic package of claim 1, further comprising:
a first chip and a second chip spaced apart from the first chip by the protection element.

8. The electronic package of claim 1, wherein the first component is free from vertically overlapping the protection element.

9. An electronic device, comprising:
a first substrate;
a temperature-dependent shape changing material electrically connected to the first substrate;
a first component disposed on the first substrate; and
an element defining a first space accommodating the first component, wherein a thickness of the temperature-dependent shape changing material is substantially defined by a height of the element, and the temperature-dependent shape changing material is spaced apart from the element.

10. The electronic package of claim 9, wherein the temperature-dependent shape changing material laterally overlaps the element.

11. The electronic package of claim 9, further comprising:
a first encapsulant surrounding the temperature-dependent shape changing material.

12. The electronic package of claim 11, further comprising:
a second substrate supporting the first encapsulant; and
a second encapsulant, wherein the first encapsulant is disposed between the second encapsulant and the second substrate.

13. The electronic package of claim 12, wherein the temperature-dependent shape changing material is spaced apart from the second encapsulant by the first encapsulant.

14. The electronic package of claim 12, wherein the second substrate comprises a flexible material.

15. The electronic package of claim 9, wherein a thickness of the temperature-dependent shape changing material is substantially the same as that of the element.

16. An electronic package, comprising:
a flexible element; and
a sensing device connected to the flexible element and configured to detect an external signal, wherein the sensing device has a sensing region exposed from the flexible element and facing an object when the electronic package is attached to the object;
a protection element surrounding the sensing device; and
an encapsulant disposed on the flexible element,
wherein the flexible element is in contact with the protection element and the encapsulant.

17. The electronic package of claim 16, wherein the encapsulant comprises a flexible material.

18. The electronic package of claim 16, wherein the sensing device is configured to receive the external signal transmitted through the flexible element.

19. The electronic package of claim 16, wherein the protection element is disposed on the flexible element, and wherein a lateral surface of the protection element and a lateral surface of the flexible element collectively defines an opening, and the lateral surface of the protection element is substantially aligned with the lateral surface of the flexible element.

* * * * *